United States Patent
Lin et al.

(10) Patent No.: US 9,865,525 B2
(45) Date of Patent: *Jan. 9, 2018

(54) SEMICONDUCTOR METHOD AND DEVICE OF FORMING A FAN-OUT POP DEVICE WITH PWB VERTICAL INTERCONNECT UNITS

(71) Applicant: STATS ChipPAC, Ltd., Singapore (SG)

(72) Inventors: Yaojian Lin, Singapore (SG); Pandi C. Marimuthu, Singapore (SG); Kang Chen, Singapore (SG); Yu Gu, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 14/326,789

(22) Filed: Jul. 9, 2014

(65) Prior Publication Data
US 2014/0319679 A1 Oct. 30, 2014

Related U.S. Application Data

(63) Continuation of application No. 13/429,119, filed on Mar. 23, 2012, now Pat. No. 8,810,024.

(51) Int. Cl.
*H01L 21/48* (2006.01)
*H01L 23/522* (2006.01)
(Continued)

(52) U.S. Cl.
CPC ............ *H01L 23/481* (2013.01); *H01L 21/56* (2013.01); *H01L 21/563* (2013.01);
(Continued)

(58) Field of Classification Search
CPC ............... H01L 23/5226; H01L 23/528; H01L 23/5283; H01L 23/5389; H01L 21/4846; H01L 21/486
(Continued)

(56) References Cited

U.S. PATENT DOCUMENTS

| | | |
|---|---|---|
| 5,148,266 A | 9/1992 | Khandros et al. |
| 5,773,884 A | 6/1998 | Andros et al. |

(Continued)

FOREIGN PATENT DOCUMENTS

| | | |
|---|---|---|
| TW | 201108335 A1 | 3/2011 |
| TW | 201142932 A | 12/2011 |

OTHER PUBLICATIONS

Inventor: Yaojian Lin, U.S. Appl. No. 13/931,397, filed Jun. 28, 2013, Title: Semiconductor Device and Method of Forming Low Profile 3D Fan-Out Package.

*Primary Examiner* — David Zarneke
(74) *Attorney, Agent, or Firm* — Robert D. Atkins; Patent Law Group: Atkins and Associates, P.C.

(57) ABSTRACT

A semiconductor device has a carrier with a die attach area. A semiconductor die is mounted to the die attach area with a back surface opposite the carrier. A modular interconnect unit is mounted over the carrier and around or in a peripheral region around the semiconductor die such that the modular interconnect unit is offset from the back surface of the semiconductor die. An encapsulant is deposited over the carrier, semiconductor die, and modular interconnect unit. A first portion of the encapsulant is removed to expose the semiconductor die and a second portion is removed to expose the modular interconnect unit. The carrier is removed. An interconnect structure is formed over the semiconductor die and modular interconnect unit. The modular interconnect unit includes a vertical interconnect structures or bumps through the semiconductor device. The modular interconnect unit forms part of an interlocking pattern around the semiconductor die.

25 Claims, 24 Drawing Sheets

(51) Int. Cl.
*H01L 23/528* (2006.01)
*H01L 23/538* (2006.01)
*H01L 23/48* (2006.01)
*H01L 23/13* (2006.01)
*H01L 23/00* (2006.01)
*H01L 21/56* (2006.01)
*H01L 23/28* (2006.01)
H01L 23/498 (2006.01)

(52) U.S. Cl.
CPC ............ *H01L 21/568* (2013.01); *H01L 23/13* (2013.01); *H01L 23/28* (2013.01); *H01L 23/49827* (2013.01); *H01L 23/5389* (2013.01); *H01L 24/10* (2013.01); *H01L 24/19* (2013.01); *H01L 24/81* (2013.01); *H01L 24/96* (2013.01); *H01L 24/97* (2013.01); *H01L 21/486* (2013.01); *H01L 21/4846* (2013.01); *H01L 23/49816* (2013.01); *H01L 23/528* (2013.01); *H01L 23/5226* (2013.01); *H01L 23/5283* (2013.01); *H01L 2224/12105* (2013.01); *H01L 2224/16225* (2013.01); *H01L 2224/24155* (2013.01); *H01L 2224/24195* (2013.01); *H01L 2224/48091* (2013.01); *H01L 2224/48247* (2013.01); *H01L 2224/73265* (2013.01); *H01L 2225/1035* (2013.01); *H01L 2924/00011* (2013.01); *H01L 2924/01322* (2013.01); *H01L 2924/12041* (2013.01); *H01L 2924/12042* (2013.01); *H01L 2924/1306* (2013.01); *H01L 2924/13091* (2013.01); *H01L 2924/15311* (2013.01); *H01L 2924/181* (2013.01); *H01L 2924/3511* (2013.01)

(58) Field of Classification Search
USPC .......................... 438/675, 672, 667, 666, 629
See application file for complete search history.

(56) References Cited

U.S. PATENT DOCUMENTS

| | | | |
|---|---|---|---|
| 5,953,816 A | 9/1999 | Pai et al. | |
| 6,022,758 A * | 2/2000 | Badehi | H01L 24/02 257/E21.508 |
| 6,191,023 B1 | 2/2001 | Chen | |
| 6,569,712 B2 | 5/2003 | Ho et al. | |
| 6,680,529 B2 | 1/2004 | Chen et al. | |
| 6,815,712 B1 | 11/2004 | Kline | |
| 6,818,978 B1 | 11/2004 | Fan | |
| 7,169,694 B2 | 1/2007 | Pozder et al. | |
| 7,235,431 B2 | 6/2007 | Wood et al. | |
| 7,239,014 B2 * | 7/2007 | Ogawa et al. | 257/700 |
| 7,545,047 B2 | 6/2009 | Bauer et al. | |
| 7,648,911 B2 | 1/2010 | Pagaila et al. | |
| 7,659,145 B2 | 2/2010 | Do et al. | |
| 7,838,337 B2 | 11/2010 | Marimuthu et al. | |
| 7,859,085 B2 | 12/2010 | Pagaila et al. | |
| 7,948,095 B2 * | 5/2011 | Ng et al. | 257/790 |
| 8,012,797 B2 | 9/2011 | Shen et al. | |
| 8,105,875 B1 | 1/2012 | Hu et al. | |
| 8,138,609 B2 | 3/2012 | Horiuchi et al. | |
| 8,148,256 B2 | 4/2012 | Hebert et al. | |
| 8,237,278 B2 | 8/2012 | Gluschenkov et al. | |
| 8,247,269 B1 * | 8/2012 | Liu | H01L 24/19 257/E21.505 |
| 8,263,439 B2 | 9/2012 | Marimuthu et al. | |
| 8,304,900 B2 | 11/2012 | Jang et al. | |
| 8,378,480 B2 | 2/2013 | Chen et al. | |
| 8,405,212 B2 | 3/2013 | Chu et al. | |
| 8,421,202 B2 | 4/2013 | Shim et al. | |
| 8,471,154 B1 | 6/2013 | Yoshida et al. | |
| 8,508,954 B2 | 8/2013 | Kwon et al. | |
| 8,552,548 B1 | 10/2013 | Do et al. | |
| 8,592,992 B2 | 11/2013 | Lin et al. | |
| 8,633,598 B1 | 1/2014 | St. Amand | |
| 8,659,162 B2 | 2/2014 | Suthiwongsunthorn et al. | |
| 8,779,601 B2 | 7/2014 | Gan et al. | |
| 8,796,561 B1 | 8/2014 | Scanlan et al. | |
| 8,802,554 B2 | 8/2014 | Sutardja | |
| 8,810,024 B2 * | 8/2014 | Lin | H01L 23/13 257/621 |
| 8,884,422 B2 * | 11/2014 | Goh | H01L 25/16 257/686 |
| 8,912,662 B2 | 12/2014 | Chun | |
| 8,987,896 B2 * | 3/2015 | Cheah | H01L 23/49833 257/724 |
| 9,171,792 B2 | 10/2015 | Sun et al. | |
| 9,209,163 B2 | 12/2015 | Kao et al. | |
| 9,258,922 B2 * | 2/2016 | Chen | H01L 23/49827 |
| 9,391,041 B2 | 7/2016 | Lin | |
| 9,406,580 B2 | 8/2016 | Erhart et al. | |
| 9,679,863 B2 | 6/2017 | Lin et al. | |
| 2002/0135057 A1 * | 9/2002 | Kurita | H01L 25/0657 257/685 |
| 2005/0121764 A1 | 6/2005 | Mallik et al. | |
| 2006/0194373 A1 | 8/2006 | Fee et al. | |
| 2007/0158813 A1 | 7/2007 | Kim | |
| 2007/0190690 A1 | 8/2007 | Chow et al. | |
| 2007/0228543 A1 | 10/2007 | Walter et al. | |
| 2009/0057849 A1 * | 3/2009 | Tang | H01L 24/20 257/664 |
| 2009/0127686 A1 | 5/2009 | Yang et al. | |
| 2009/0146315 A1 | 6/2009 | Shim et al. | |
| 2009/0166886 A1 | 7/2009 | Kim et al. | |
| 2009/0311829 A1 * | 12/2009 | Yang | H01L 21/561 438/109 |
| 2010/0006330 A1 | 1/2010 | Fu et al. | |
| 2010/0013081 A1 * | 1/2010 | Toh | H01L 21/6835 257/692 |
| 2010/0109169 A1 | 5/2010 | Kolan et al. | |
| 2010/0133704 A1 | 6/2010 | Marimuthu et al. | |
| 2010/0171205 A1 | 7/2010 | Chen et al. | |
| 2010/0171207 A1 | 7/2010 | Shen et al. | |
| 2010/0221873 A1 | 9/2010 | Marimuthu et al. | |
| 2010/0276792 A1 | 11/2010 | Chi et al. | |
| 2011/0012266 A1 * | 1/2011 | Horiuchi | H01L 21/561 257/773 |
| 2011/0037155 A1 | 2/2011 | Pagaila | |
| 2011/0068459 A1 | 3/2011 | Pagaila et al. | |
| 2011/0215470 A1 * | 9/2011 | Chen | H01L 23/52 257/738 |
| 2011/0217812 A1 | 9/2011 | Hedler et al. | |
| 2011/0221057 A1 | 9/2011 | Lin et al. | |
| 2011/0278707 A1 | 11/2011 | Chi et al. | |
| 2011/0278736 A1 | 11/2011 | Lin et al. | |
| 2011/0309490 A1 | 12/2011 | Lu et al. | |
| 2012/0074585 A1 | 3/2012 | Koo et al. | |
| 2012/0074587 A1 | 3/2012 | Koo et al. | |
| 2012/0319294 A1 | 12/2012 | Lee et al. | |
| 2013/0049217 A1 * | 2/2013 | Gong | H01L 23/49822 257/774 |
| 2013/0062760 A1 | 3/2013 | Hung et al. | |
| 2013/0075936 A1 | 3/2013 | Lin et al. | |
| 2013/0105991 A1 | 5/2013 | Gan et al. | |
| 2013/0154108 A1 | 6/2013 | Lin et al. | |
| 2013/0182402 A1 | 7/2013 | Chen et al. | |
| 2013/0228917 A1 | 9/2013 | Yoon et al. | |
| 2013/0249106 A1 | 9/2013 | Lin et al. | |
| 2014/0070368 A1 * | 3/2014 | Oyamada | H01L 25/0657 257/532 |
| 2014/0110856 A1 * | 4/2014 | Lin | H01L 24/19 257/774 |
| 2014/0110860 A1 | 4/2014 | Choi et al. | |

\* cited by examiner

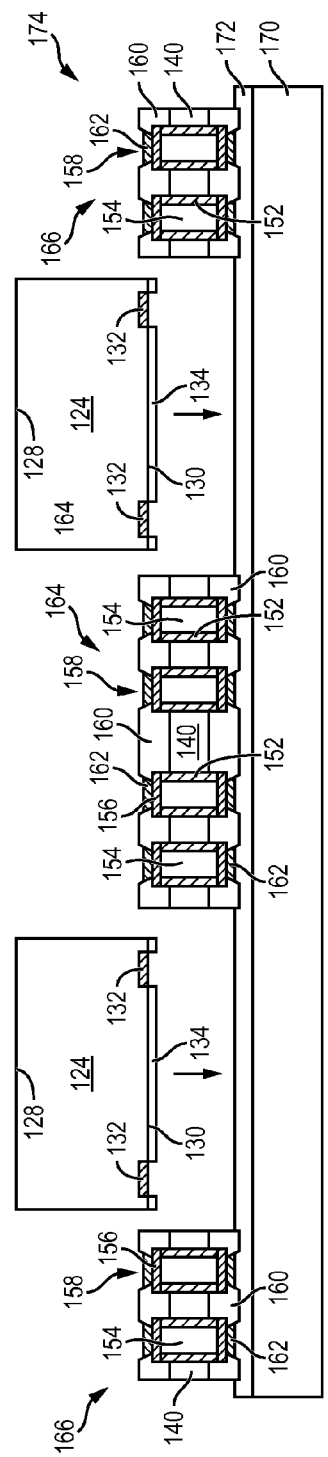
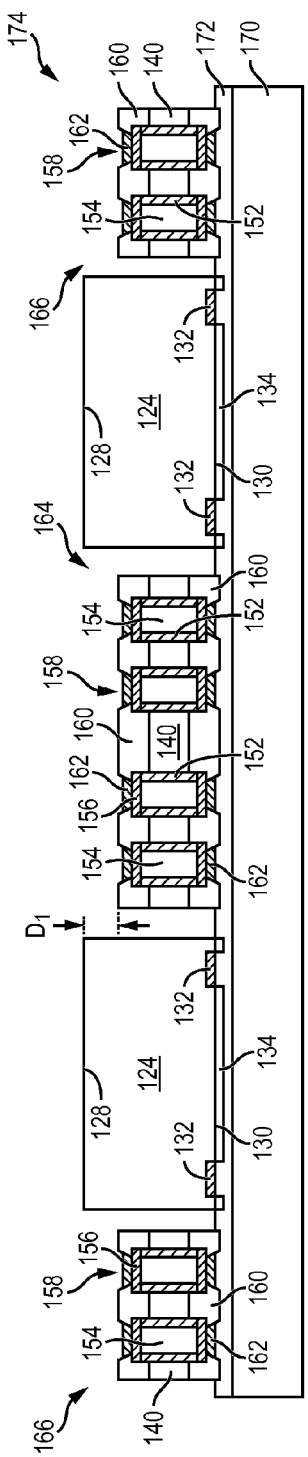
FIG. 5a
FIG. 5b

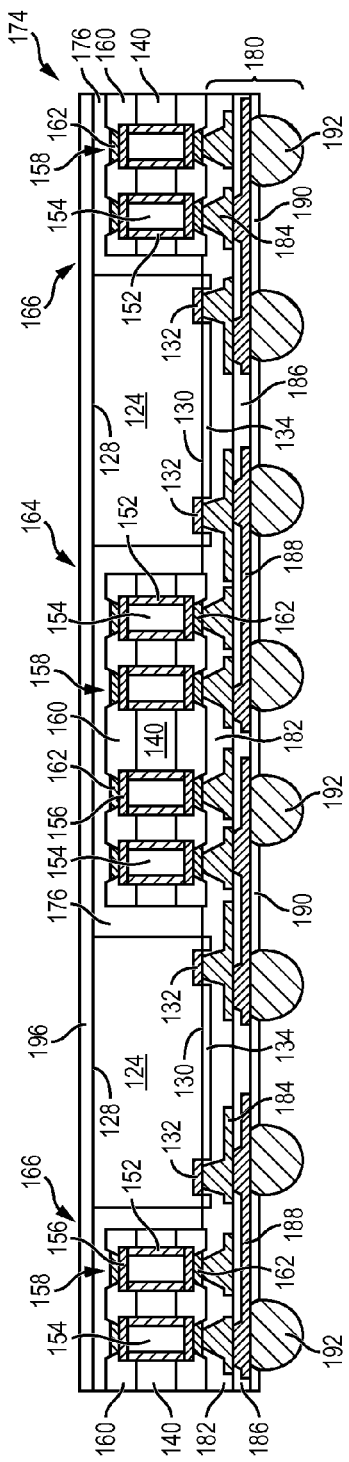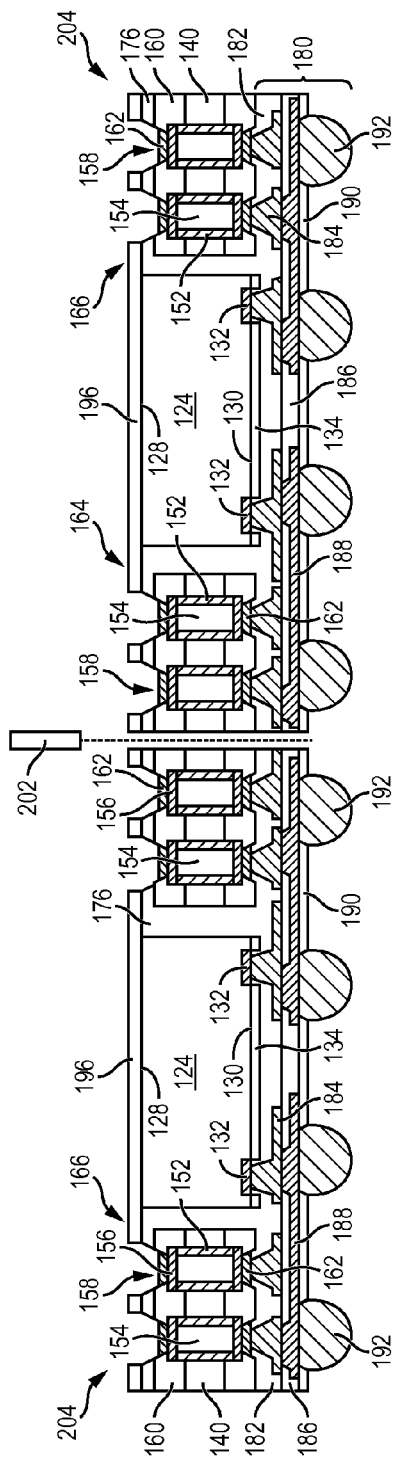

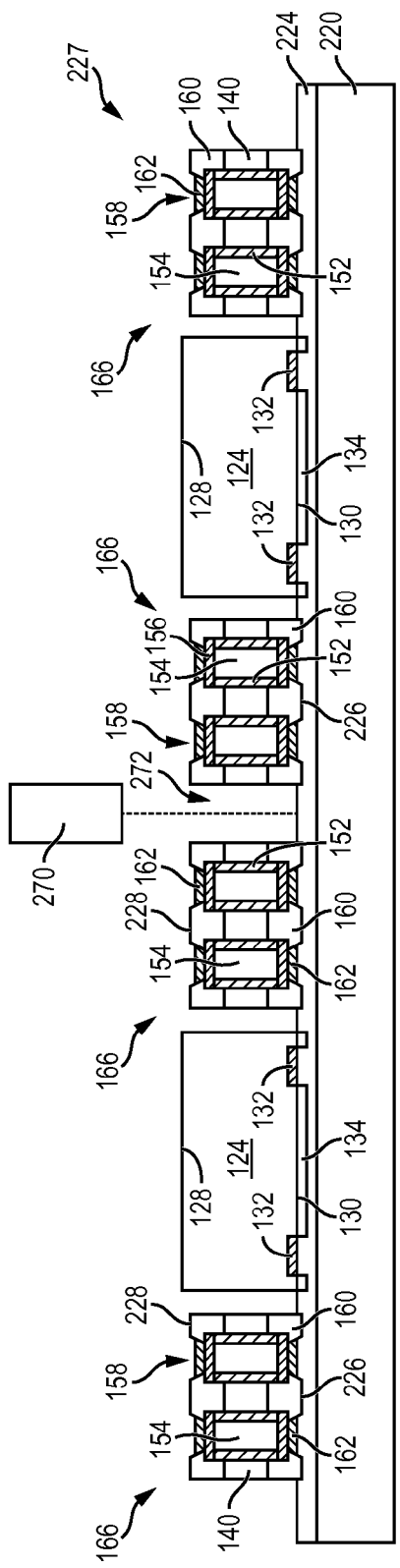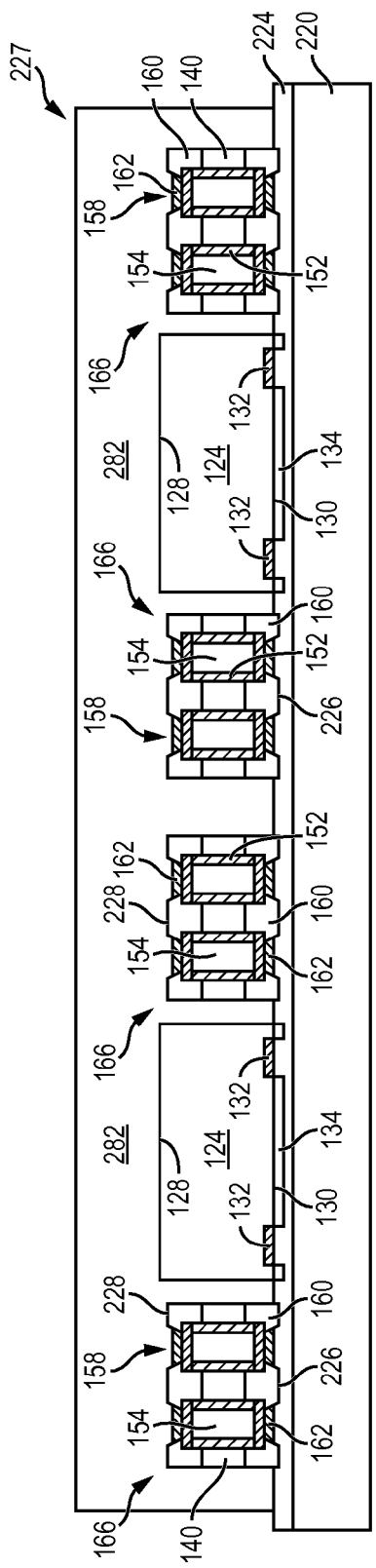

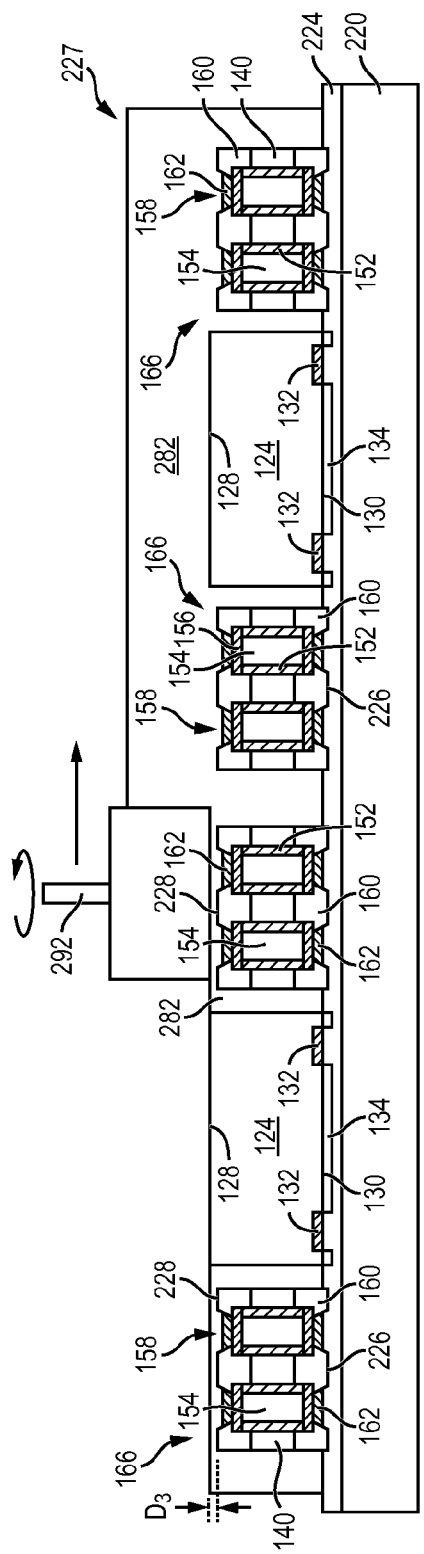
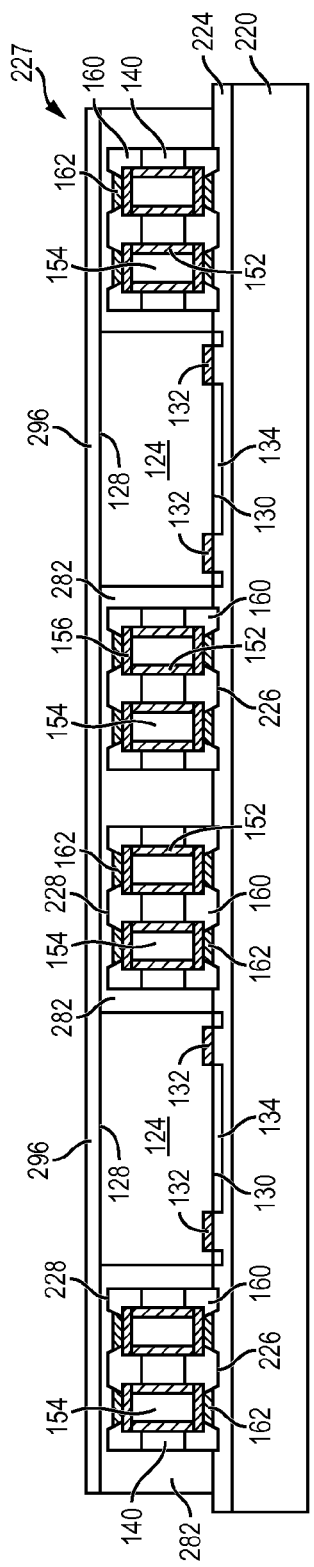

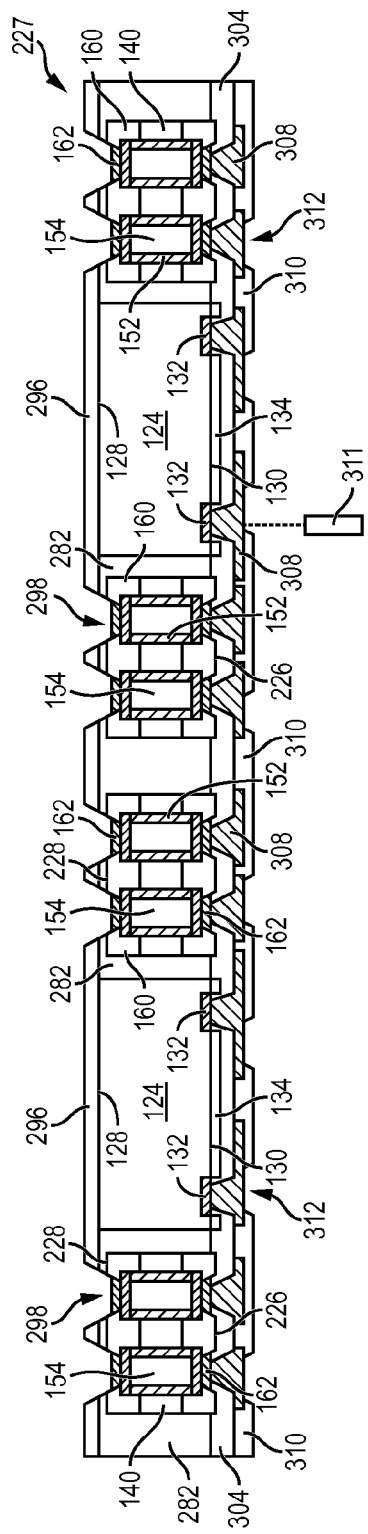
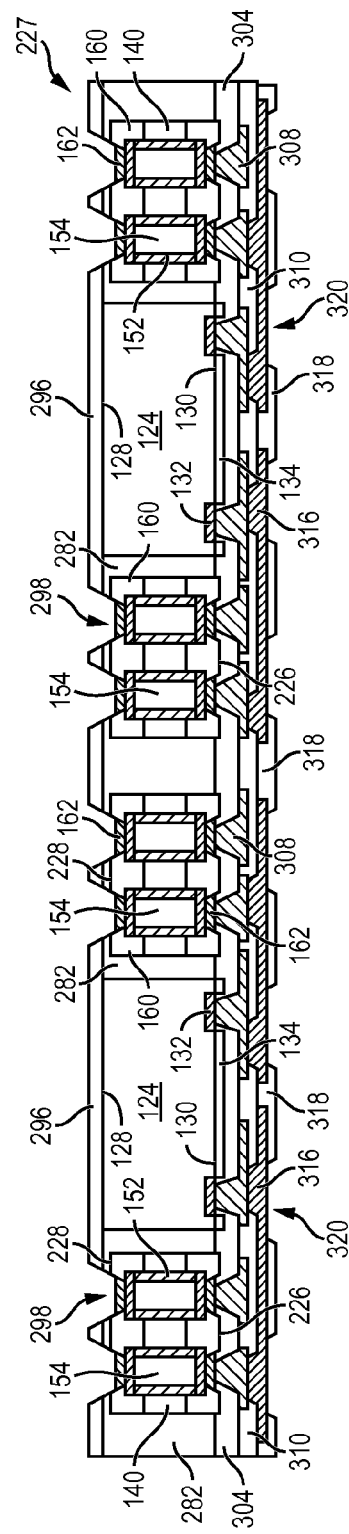
FIG. 6p
FIG. 6q

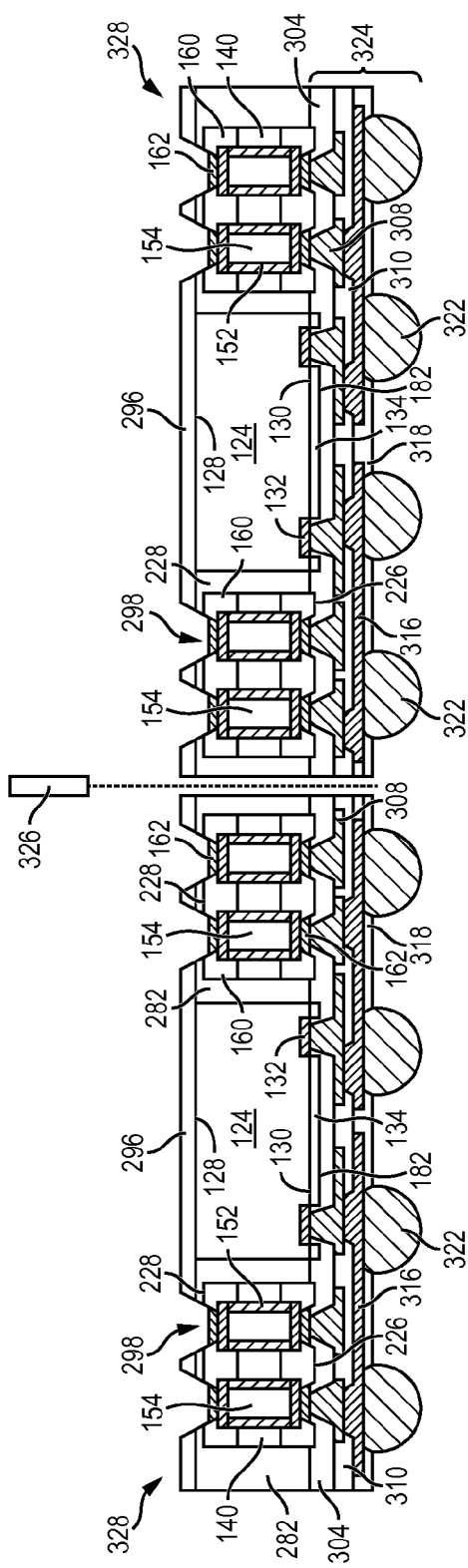
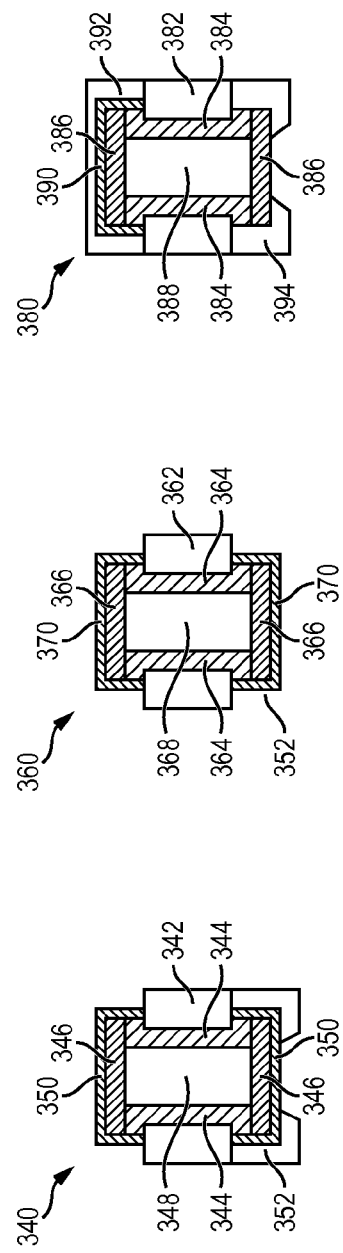
FIG. 6r
FIG. 7a  FIG. 7b  FIG. 7c

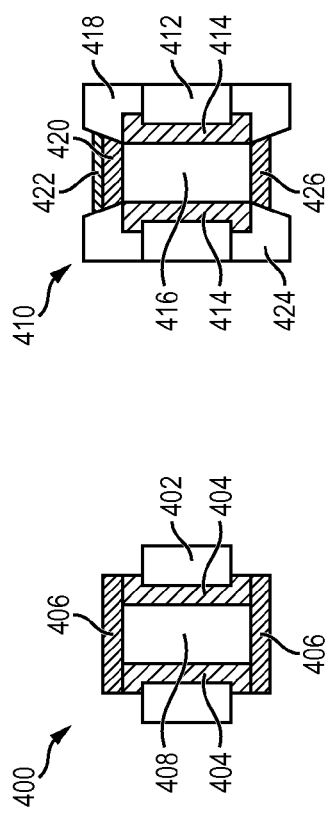
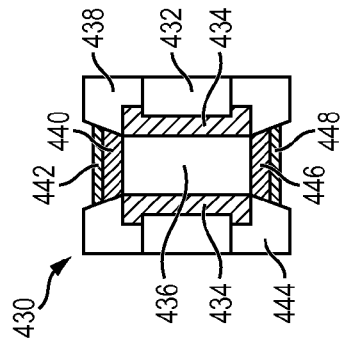
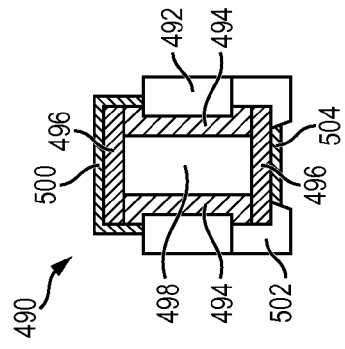
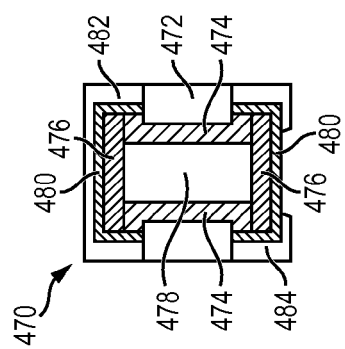
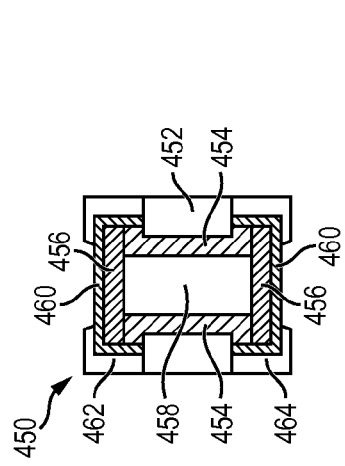

SEMICONDUCTOR METHOD AND DEVICE OF FORMING A FAN-OUT POP DEVICE WITH PWB VERTICAL INTERCONNECT UNITS

CLAIM TO DOMESTIC PRIORITY

The present application is a continuation of U.S. patent application Ser. No. 13/429,119, now U.S. Pat. No. 8,810,024, filed Mar. 23, 2012, which application is incorporated herein by reference.

FIELD OF THE INVENTION

The present invention relates in general to semiconductor devices and, more particularly, to a semiconductor device and method of forming a fan-out package-on-package (Fo-PoP) with printed wiring board (PWB) modular vertical interconnect units.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

One approach to achieving the objectives of greater integration and smaller semiconductor devices is to focus on three dimensional (3D) packaging technologies including PoP. However, PoP often require laser drilling to form interconnect structures, which increases equipment cost and requires drilling through an entire package thickness. Laser drilling increases cycle time and decreases manufacturing throughput. Vertical interconnections formed exclusively by a laser drilling process can result in reduced control for vertical interconnections. Unprotected contacts can also lead to increases in yield loss for interconnections formed with subsequent surface mount technology (SMT). Furthermore, conductive materials used for forming vertical interconnects within PoP, such as copper (Cu), can incidentally be transferred to semiconductor die during package formation, thereby contaminating the semiconductor die within the package.

SUMMARY OF THE INVENTION

A need exists for vertical interconnects in a Fo-PoP without laser drilling through the package. Accordingly, in one embodiment, the present invention is a method of making a semiconductor device comprising the steps of providing a plurality of interconnect structures, disposing an encapsulant over the interconnect structures, singulating through the encapsulant between the interconnect structures to form a modular interconnect unit, and disposing a semiconductor die in a peripheral region of the modular interconnect unit.

In another embodiment, the present invention is a method of making a semiconductor device comprising the steps of providing a substrate, forming an interconnect structure through the substrate, singulating through the substrate to form a modular interconnect unit, and disposing a semiconductor die in a peripheral region of the modular interconnect unit.

In another embodiment, the present invention is a semiconductor device comprising a modular interconnect unit. An interconnect structure is formed through the modular interconnect unit. A semiconductor die is disposed in a peripheral region of the modular interconnect unit.

In another embodiment, the present invention is a semiconductor device comprising a modular interconnect unit. A semiconductor die is disposed in a peripheral region of the modular interconnect unit.

BRIEF DESCRIPTION OF THE DRAWINGS

FIGS. 5a-5i illustrate a process of forming a Fo-PoP with semiconductor die interconnected by PWB modular units having vertical interconnect structures;

FIGS. 7a-7i illustrate various conductive vertical interconnect structures for PWB modular units;

DETAILED DESCRIPTION OF THE DRAWINGS

Figure 1:
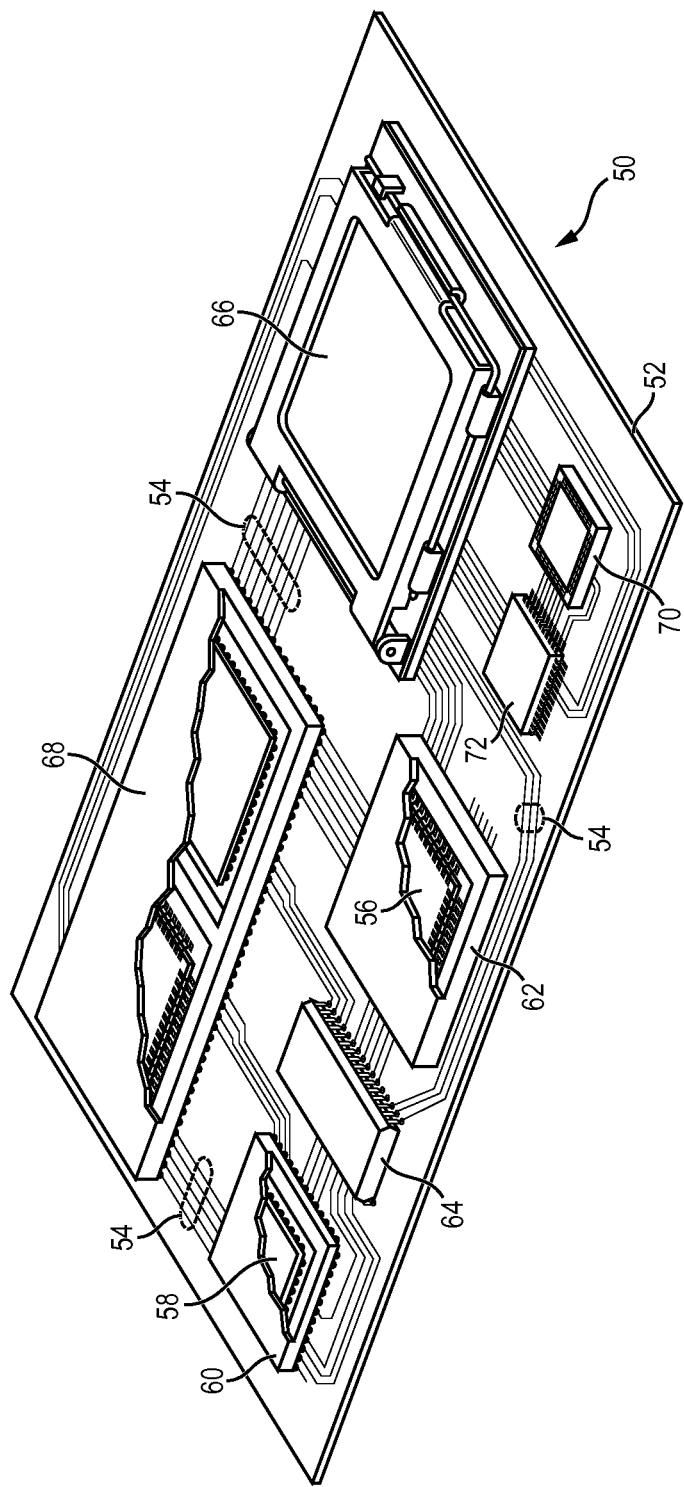
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisoprenes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photo-solubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
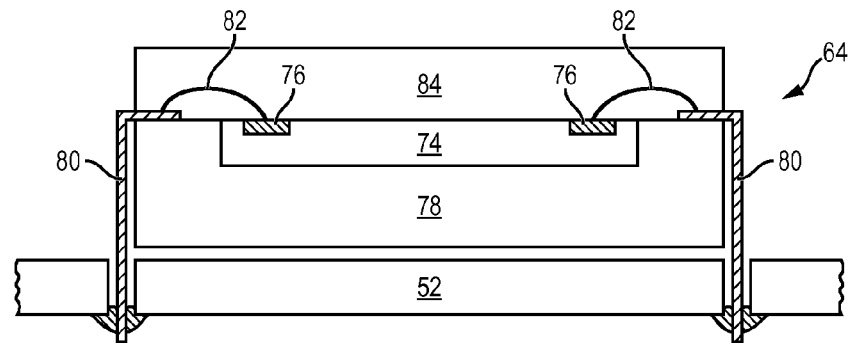
FIGS. 2a-2c illustrate further detail of the representative semiconductor packages mounted to the PCB.
Figure 2B:
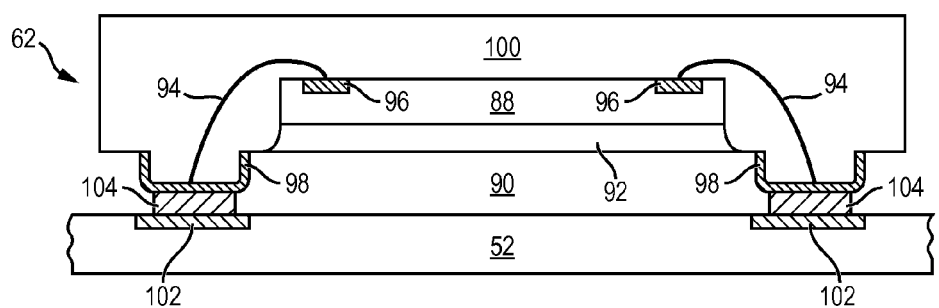
Figure 2C:
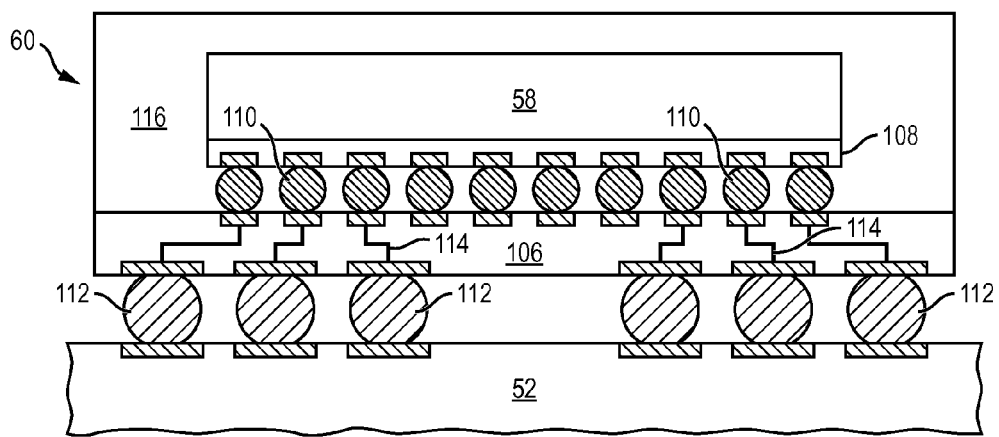

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), Cu, tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
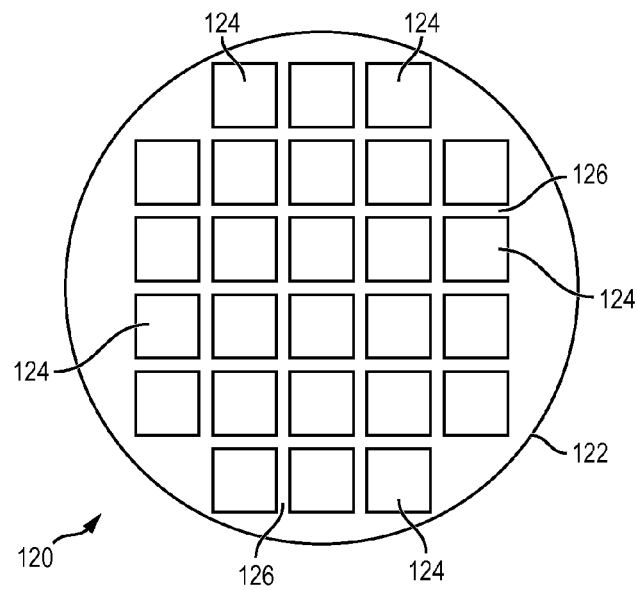
FIGS. 3a-3c illustrate a semiconductor wafer with a plurality of semiconductor die separated by saw streets.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
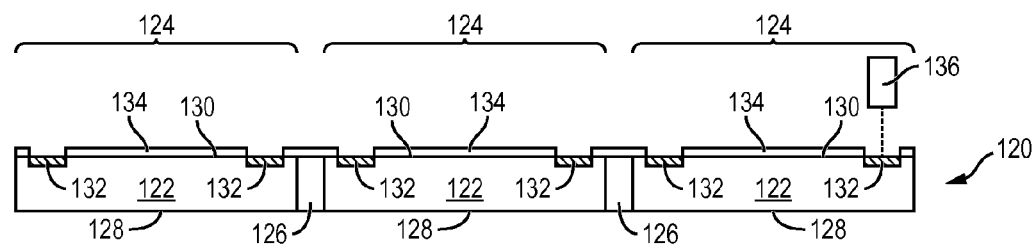

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 3b. Alternatively, conductive layer 132 can be formed as contact pads that are in multiple rows such that a first row of contact pads is disposed a first distance from the edge of the die, and a second row of contact pads alternating with the first row is disposed a second distance from the edge of the die.

An insulating or passivation layer 134 is conformally applied over active surface 130 using PVD, CVD, screen printing, spin coating, or spray coating. The insulating layer 134 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The insulating layer 134 covers and provides protection for active surface 130. A portion of insulating layer 134 is removed by laser direct ablation (LDA) using laser 136 or other suitable process to expose conductive layer 132 and provide for subsequent electrical interconnect.

Figure 3C:
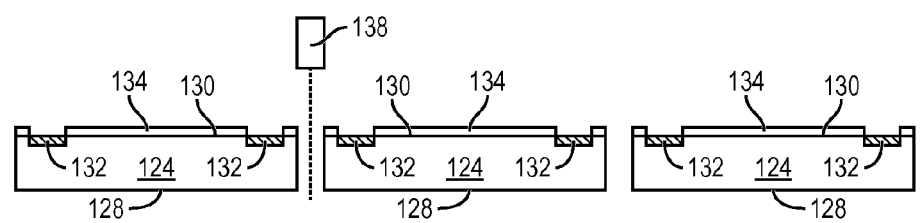

In FIG. 3c, semiconductor wafer 120 is singulated through saw street 126 using a saw blade or laser cutting tool 138 into individual semiconductor die 124.

Figure 4A:
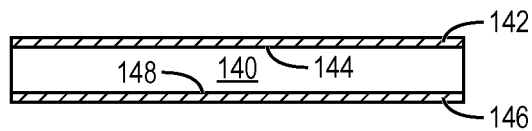
FIGS. 4a-4h illustrate a process of forming PWB modular units with vertical interconnect structures for a Fo-PoP.

FIGS. 4a-4h and 5a-5i illustrate, in relation to FIGS. 1 and 2a-2c, a process of forming a Fo-PoP with PWB modular vertical interconnect units. FIG. 4a shows a cross-sectional view of a portion of laminate core 140. An optional conductive layer 142 is formed over surface 144 of core 140, and optional conductive layer 146 is formed over surface 148 of the core. Conductive layers 142 and 146 are formed using a metal deposition process such as Cu foil lamination, printing, PVD, CVD, sputtering, electrolytic plating, and electroless plating. Conductive layers 142 and 146 can be one or more layers of Al, Cu, Sn, Ni, Au, Ag, titanium (Ti), tungsten (W), or other suitable electrically conductive material. In one embodiment, conductive layers 142 and 146 are Cu foil having a thickness of 20-200 micrometers (µm). Conductive layers 142 and 146 can be thinned by a wet etching process.

Figure 4B:
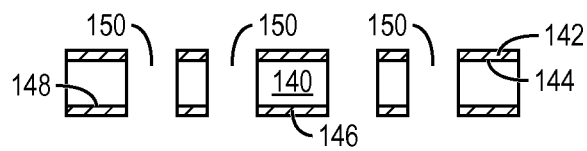

In FIG. 4b, a plurality of vias 150 is formed through laminate core 140 and conductive layers 142 and 146 using laser drilling, mechanical drilling, deep reactive ion etching (DRIE), or other suitable process. Vias 150 extend through laminate core 140. Vias 150 are cleaned by desmearing process.

Figure 4C:
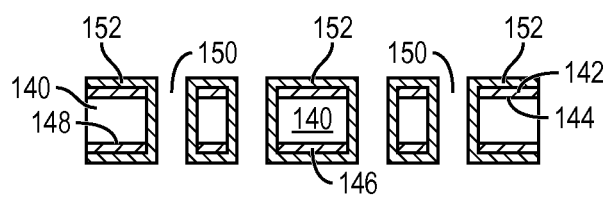

In FIG. 4c, a conductive layer 152 is formed over laminate core 140, conductive layers 142 and 146, and sidewalls of vias 150 using a metal deposition process such as printing, PVD, CVD, sputtering, electrolytic plating, and electroless plating. Conductive layer 152 can be one or more layers of Al, Cu, Sn, Ni, Au, Ag, Ti, W, or other suitable electrically conductive material. In one embodiment, conductive layer 152 includes a first Cu layer formed by electroless plating, followed by a second Cu layer formed by electrolytic plating.

Figure 4D:
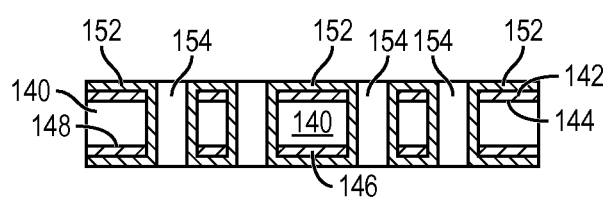

In FIG. 4d, the remaining portion of vias 150 is filled with an insulating or conductive material with filler material 154. The insulating material with insulating filler can be polymer dielectric material with filler and one or more of SiO2, Si3N4, SiON, Ta2O5, Al2O3, or other material having similar insulating and structural properties. The conductive filler material can be one or more layers of Al, Cu, Sn, Ni, Au, Ag, or other suitable electrically conductive material. In one embodiment, filler material 154 can be a polymer plug. Alternatively, filler material 154 is Cu paste. Vias 150 can also be left as a void, i.e. without filler material. Filler material 154 is selected to be softer or more compliant than conductive layer 152. Vias 150 with filler material 154 reduce the incidence of cracking or delamination by allowing deformation or change of shape of conductive layer 152 under stress. Vias 150 can also be completely filled with conductive layer 152.

Figure 4E:
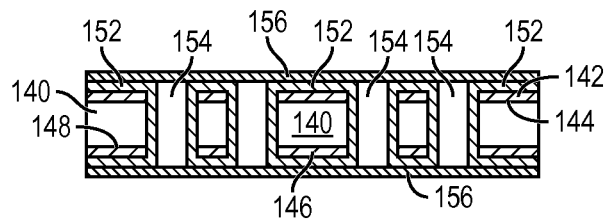

In FIG. 4e, a conductive layer 156 is formed over conductive layer 152 and filler material 154 using a metal deposition process such as printing, PVD, CVD, sputtering, electrolytic plating, and electroless plating. Conductive layer 156 can be one or more layers of Al, Cu, Sn, Ni, Au, Ag, Ti, W, or other suitable electrically conductive material. In one embodiment, conductive layer 156 includes a first Cu layer formed by electroless plating, followed by a second Cu layer formed by electrolytic plating.

Figure 4F:
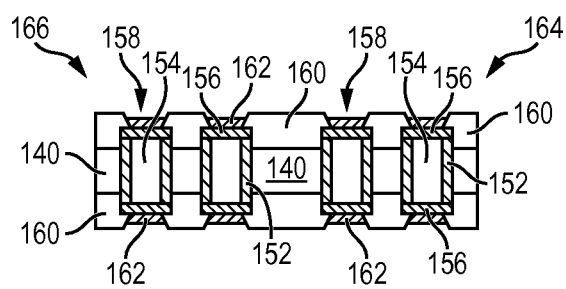

In FIG. 4f, a portion of conductive layers 142, 144, 146, 148, 152, and 156 is removed by a wet etching process through a patterned photoresist layer to expose laminate core 140 and leave conductive vertical interconnect structures 158 through laminate core 140. An insulating or passivation layer 160 is formed over laminate core 140 and conductive vertical interconnect structures 158 using vacuum lamination, spin coating, spray coating, screen printing, or other printing process. The insulating layer 160 contains one or more layers of polymer dielectric material with or without insulating filler of SiO2, Si3N4, SiON, Ta2O5, Al2O3, or other material having similar insulating and structural properties. A portion of insulating layer 160 is removed by an etching process or LDA to expose conductive layer 156 and facilitate the formation of subsequent conductive layers.

An optional conductive layer 162 can be formed over the exposed conductive layer 156 using a metal deposition process such as electrolytic plating and electroless plating. Conductive layer 162 can be one or more layers of Al, Cu, Sn, Ni, Au, Ag, Ti, W, or other suitable electrically conductive material. In one embodiment, conductive layer 162 is a Cu protective layer.

Figure 4H:
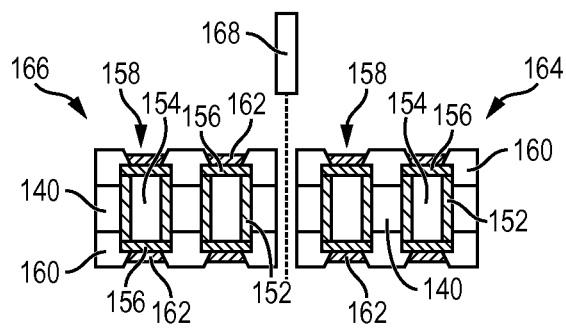
Figure 4G:
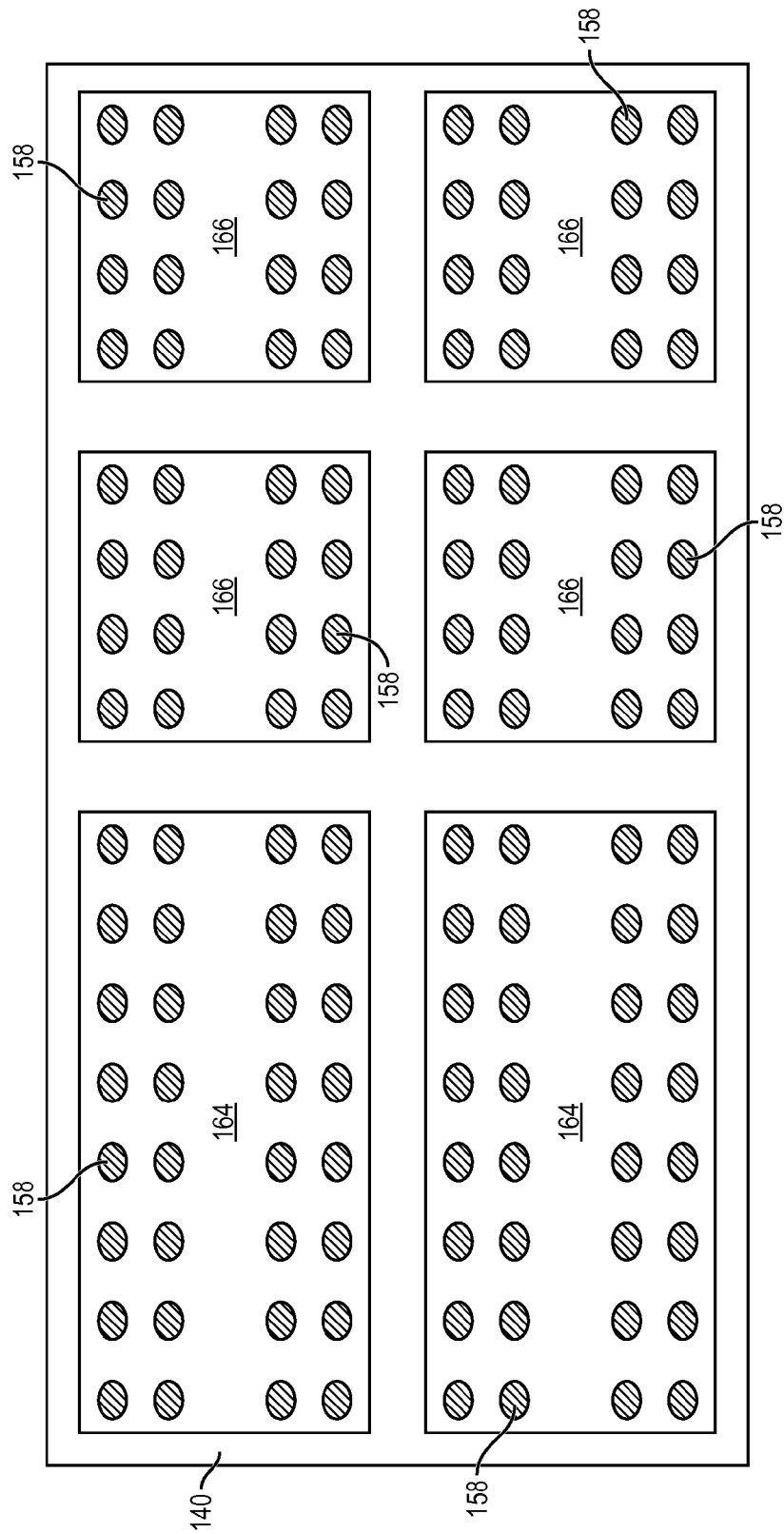

Laminate core 140 with vertical interconnect structures 158 constitute one or more PWB modular vertical interconnect units, which are disposed between semiconductor die or packages to facility electrical interconnect for a Fo-PoP. FIG. 4g shows a plan view of laminate core 140 organized into PWB modular units 164-166. PWB modular units 164-166 contain multiple rows of vertical interconnect structures 158 extending between opposing surfaces of the PWB units. PWB units 164-166 are configured for integration into Fo-PoP, and as such, differ in size one from another according to a final device configuration as discussed in more detail below. While PWB units 164-166 are illustrated in FIG. 4g as including square or rectangular footprints, alternatively, the PWB units can include cross-shaped (+), angled or "L-shaped," circular, oval, hexagonal, octagonal, star shaped, or any geometrically shaped footprint. FIG. 4h shows laminate core 140 singulated into individual PWB modular units 164 and 166 with saw blade or laser cutting tool 168.

FIG. 5a shows a cross-sectional view of a portion of a carrier or temporary substrate 170 containing sacrificial base material such as silicon, polymer, beryllium oxide, glass, or other suitable low-cost, rigid material for structural support. An interface layer or double-sided tape 172 is formed over carrier 170 as a temporary adhesive bonding film, etch-stop layer, or thermal release layer.

PWB modular units 164-166 from FIG. 4h are mounted to interface layer 172 and carrier 170 using a pick and place operation. After placing PWB units 164-166, semiconductor die 124 from FIG. 3c are mounted to interface layer 172 and carrier 170 using a pick and place operation with active surface 130 oriented toward the carrier. FIG. 5b shows semiconductor die 124 and PWB units 164-166 mounted to carrier 170 as a reconstituted wafer 174. Semiconductor die 124 extend above PWB units 164-166 by distance D1 greater than 1 μm. The offset between PWB units 164-166 and semiconductor die 124 reduces contamination during a subsequent backgrinding step.

Figure 5C:
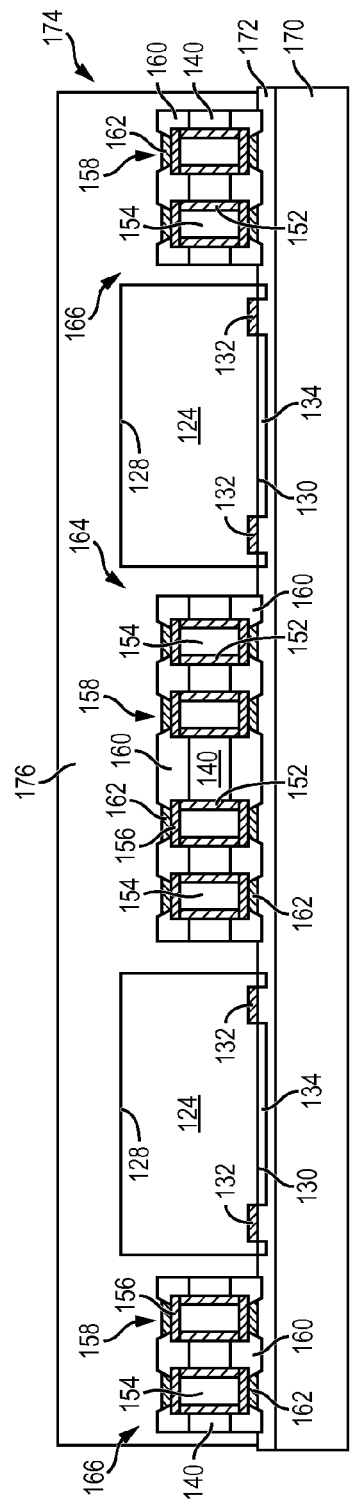

In FIG. 5c, an encapsulant or molding compound 176 is deposited over semiconductor die 124, PWB units 164-166, and carrier 170 using a paste printing, compressive molding, transfer molding, liquid encapsulant molding, vacuum lamination, spin coating, or other suitable applicator. Encapsulant 176 can be polymer composite material, such as epoxy resin with filler, epoxy acrylate with filler, or polymer with proper filler. Encapsulant 176 is non-conductive and environmentally protects the semiconductor device from external elements and contaminants.

Figure 5D:
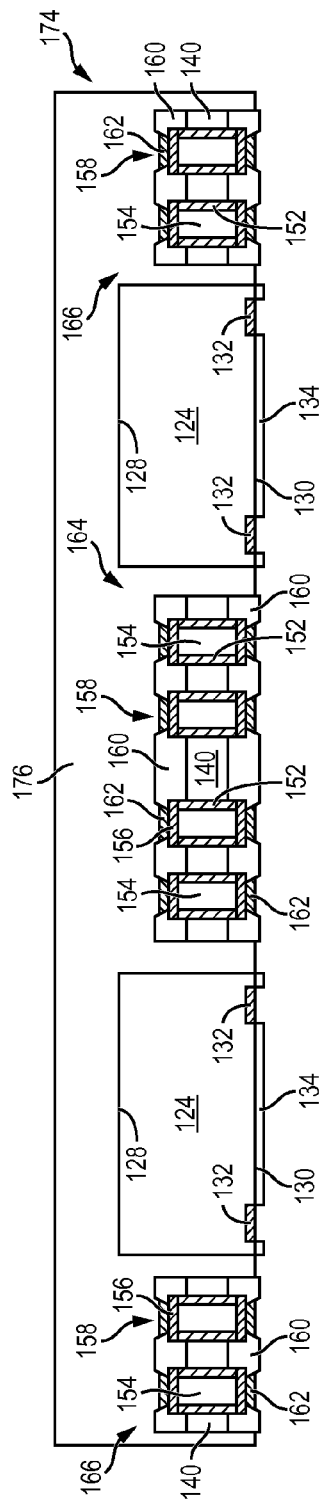

In FIG. 5d, carrier 170 and interface layer 172 are removed by chemical etching, mechanical peeling, chemical mechanical polishing (CMP) mechanical grinding, thermal bake, UV light, laser scanning, or wet stripping to expose insulating layer 134, PWB units 164-166, and encapsulant 176.

Figure 5E:
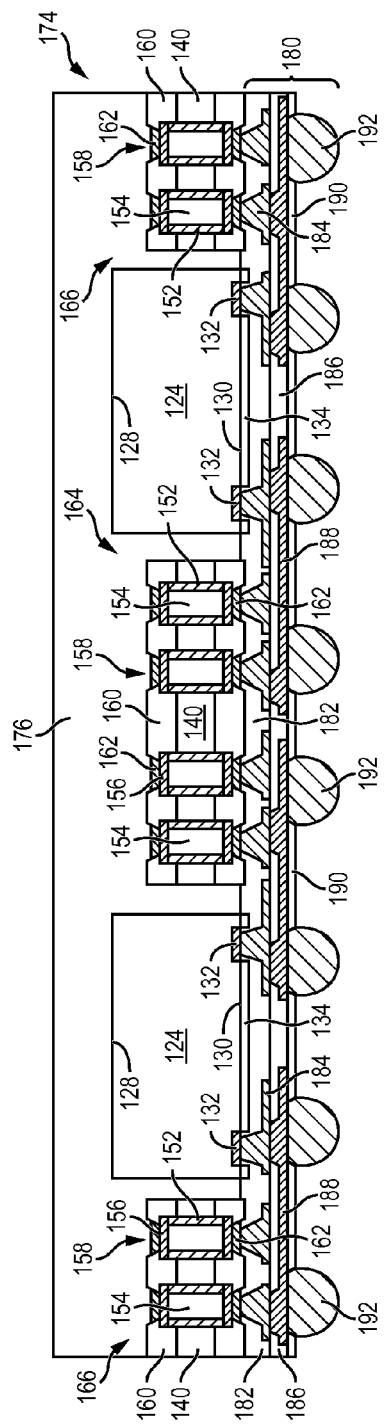

In FIG. 5e, a build-up interconnect structure 180 is formed over semiconductor die 124, PWB units 164-166, and encapsulant 176. An insulating or passivation layer 182 is formed over semiconductor die 124, PWB units 164-166, and encapsulant 176 using PVD, CVD, lamination, printing, spin coating, or spray coating. The insulating layer 182 contains one or more layers of low temperature (less than 250° C.) curing polymer dielectric with or without insulating fillers, like SiO2, Si3N4, SiON, Ta2O5, Al2O3, rubber particles, or other material having similar insulating and structural properties. A portion of insulating layer 182 can be removed by an etching process to expose vertical interconnect structures 158 of PWB units 164-166 and conductive layer 132 of semiconductor die 124.

An electrically conductive layer or RDL 184 formed over insulating layer 182 using a patterning and metal deposition process such as sputtering, electrolytic plating, and electroless plating. Conductive layer 184 can be one or more layers of Al, Cu, Sn, Ni, Au, Ag, or other suitable electrically conductive material. In one embodiment, conductive layer 184 contains Ti/Cu, TiW/Cu, or Ti/NiV/Cu. One portion of conductive layer 184 is electrically connected to contact pads 132 of semiconductor die 124. Another portion of conductive layer 184 is electrically connected to vertical interconnect structures 158 of PWB units 164-166. Other portions of conductive layer 184 can be electrically common or electrically isolated depending on the design and function of semiconductor die 124.

An insulating or passivation layer 186 is formed over insulating layer 182 and conductive layer 184 using PVD, CVD, lamination, printing, spin coating, or spray coating. The insulating layer 186 contains one or more layers of low temperature (less than 250° C.) curing polymer dielectric with or without insulating fillers, like SiO2, Si3N4, SiON, Ta2O5, Al2O3, rubber particles, or other material having similar insulating and structural properties. A portion of insulating layer 186 can be removed by an etching process to expose conductive layer 184.

An electrically conductive layer or RDL 188 formed over conductive layer 184 and insulating layer 186 using a patterning and metal deposition process such as sputtering, electrolytic plating, and electroless plating. Conductive layer 188 can be one or more layers of Al, Cu, Sn, Ni, Au, Ag, or other suitable electrically conductive material. In one embodiment, conductive layer 188 contains Ti/Cu, TiW/Cu, or Ti/NiV/Cu. One portion of conductive layer 188 is electrically connected to conductive layer 184. Other portions of conductive layer 188 can be electrically common or electrically isolated depending on the design and function of semiconductor die 124.

An insulating or passivation layer 190 is formed over insulating layer 186 and conductive layer 188 using PVD, CVD, printing, spin coating, or spray coating. The insulating layer 190 contains one or more layers of SiO2, Si3N4, SiON, Ta2O5, Al2O3, or other material having similar insulating and structural properties. A portion of insulating layer 190 can be removed by an etching process to expose conductive layer 188.

The number of insulating and conductive layers included within build-up interconnect structure 180 depends on, and varies with, the complexity of the circuit routing design. Accordingly, build-up interconnect structure 180 can include any number of insulating and conductive layers to facilitate electrical interconnect with respect to semiconductor die 124.

An electrically conductive bump material is deposited over build-up interconnect structure 180 and electrically connected to the exposed portion of conductive layer 188 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 188 using a suitable attachment or bonding process. In one embodiment, the bump material is reflowed by heating the material above its melting point to form spherical balls or bumps 192. In some applications, bumps 192 are reflowed a second time to improve electrical contact to conductive layer 188. An under bump metallization (UBM) can be formed under bumps 192. Bumps 192 can also be compression bonded to conductive layer 188. Bumps 192 represent one type of interconnect structure that can be formed over conductive layer 188. The interconnect structure can also use stud bump, micro bump, or other electrical interconnect.

Figure 5F:
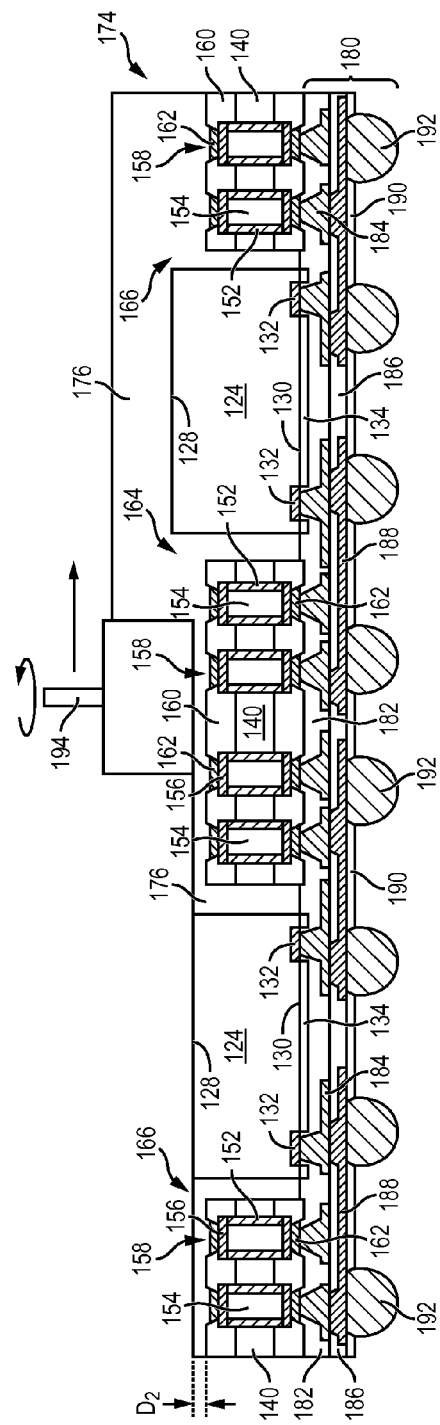

In FIG. 5f, a portion of encapsulant 176 and semiconductor die 124 is removed by a grinding operation with grinder 194 to planarize the surface and reduce a thickness of the encapsulant. Encapsulant 176 remains over PWB units 164-166 with a thickness D2 of at least 1 μm. A chemical etch, CMP, or plasma dry etch can also be used to remove back grinding damage and residue stress on semiconductor die 124 and encapsulant 176 to enhance the package strength.

In FIG. 5g, a backside balance layer 196 is applied over encapsulant 176, PWB units 164-166, and semiconductor die 124. Backside balance layer 196 balances the coefficient of thermal expansion (CTE), e.g. 30-150 ppm/K, of conductive layers 184 and 188 and reduces warpage in the package. In one embodiment, backside balance layer 196 has a thickness of 10-100 μm.

In FIG. 5h, a portion of backside balance layer 196 and encapsulant 176 removed to expose vertical interconnect structures 158. Reconstituted wafer 174 is singulated through PWB modular unit 164 with saw blade or laser cutting tool 202 into separate Fo-PoP 204.

Figure 5I:
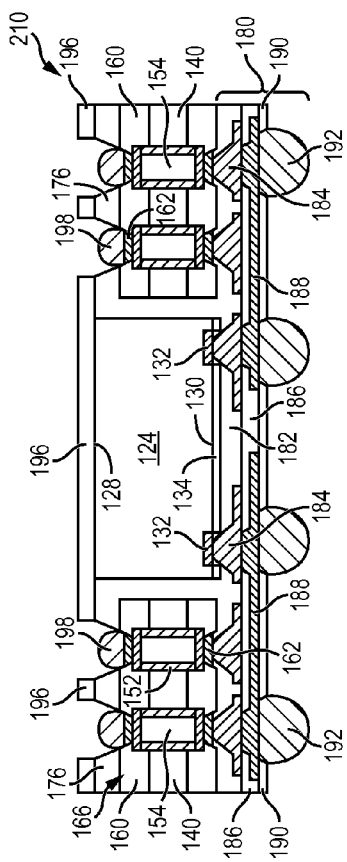

FIG. 5i shows Fo-PoP 210 with bumps 198 formed over the exposed vertical interconnect structures 158. Bumps 198 are disposed at least 1 μm below back surface 128 of semiconductor die 124. Alternatively, bumps 198 extend above backside balance layer 196 and can have a height of 25-67% of the thickness of semiconductor die 124.

PWB modular units 164-166 disposed within Fo-PoP 204 can differ in size and shape one from another while still providing through vertical interconnect for the Fo-PoP. PWB modular units 164-166 include interlocking footprints having square and rectangular shapes, a cross-shape (+), an angled or "L-shape," a circular or oval shape, a hexagonal shape, an octagonal shape, a star shape, or any other geometric shape. At the wafer level, and before singulation, PWB modular units 164-166 are disposed around semiconductor die 124 in an interlocking pattern such that different sides of the semiconductor die are aligned with, and correspond to, a number of different sides of the PWB units in a repeating pattern. PWB units 164-166 may also include additional metal layers to facilitate design integration and increased routing flexibility before build-up interconnect structure 180 is formed over the PWB units.

PWB modular units 164-166 provide a cost effective alternative to using standard laser drilling processes for vertical interconnection in Fo-PoP for a number of reasons. First, PWB units 164-166 can be made with low cost manufacturing technology such as substrate manufacturing technology. Second, standard laser drilling includes high equipment cost and requires drilling through an entire package thickness, which increases cycle time and decrease manufacturing throughput. Furthermore, the use of PWB units 164-166 for vertical interconnection provides an advantage of improved control for vertical interconnection with respect to vertical interconnections formed exclusively by a laser drilling process.

Figure 6A:
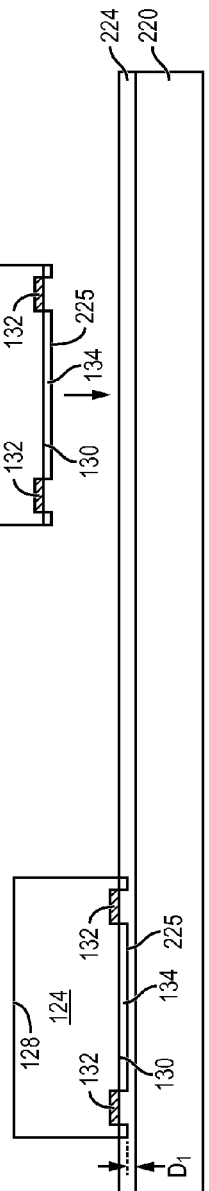
FIGS. 6a-6r illustrate another process of forming a Fo-PoP with semiconductor die interconnected by PWB modular units having vertical interconnect structures.

In another embodiment, FIG. 6a shows a cross-sectional view of a portion of a carrier or temporary substrate 220 containing sacrificial base material such as silicon, polymer, beryllium oxide, glass, or other suitable low-cost, rigid material for structural support. An interface layer or double-sided tape 224 is formed over carrier 220 as a temporary adhesive bonding film, etch-stop layer, or thermal release layer.

Figure 6B:
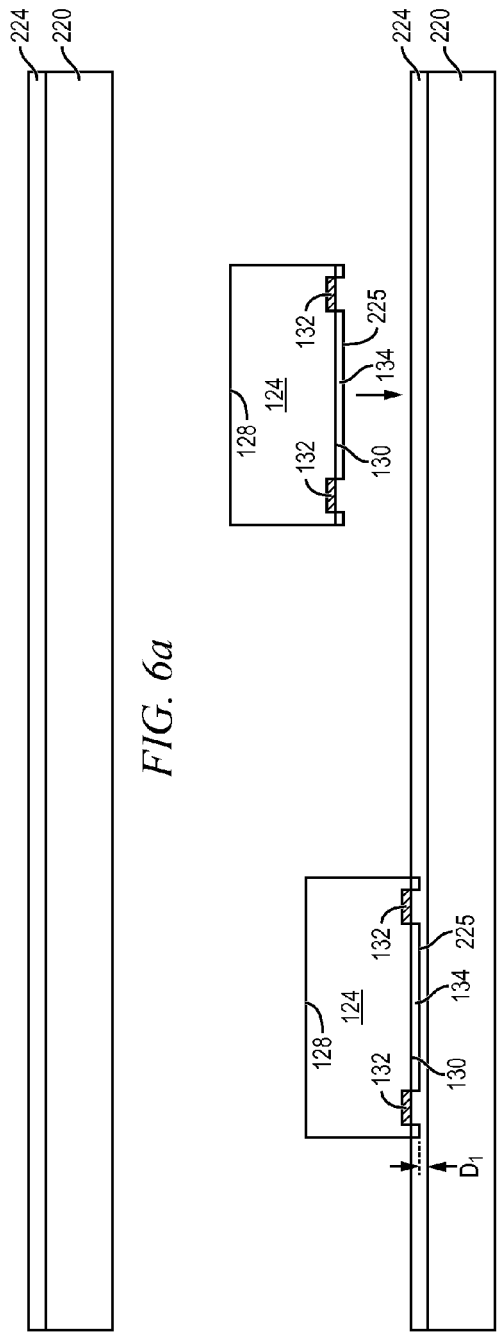

In FIG. 6b, semiconductor die 124 from FIG. 3c are mounted to interface layer 224 and carrier 220 using a pick and place operation with active surface 130 oriented toward the carrier. Semiconductor die 124 are pressed into interface layer 224 such that insulating layer 134 is disposed into the interface layer. When semiconductor die 124 is mounted to interface layer 224, a surface 225 of insulating layer 134 is separated by a distance D1 from carrier 220.

Figure 6C:
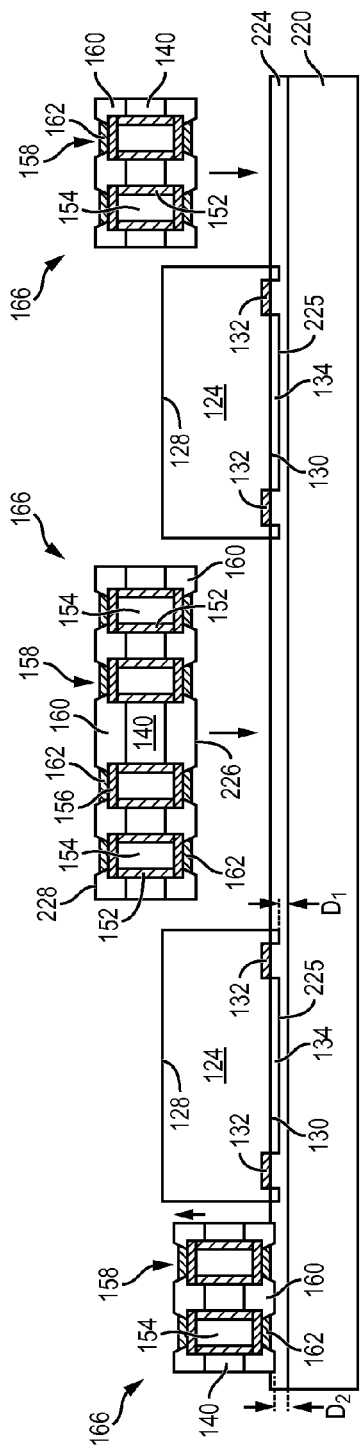

In FIG. 6c, PWB modular units 164-166 from FIG. 4h are mounted to interface layer 224 and carrier 220 using a pick and place operation. PWB units 164-166 are pressed into interface layer 224 such that contacting surface 226 is disposed into the interface layer. When PWB units 164-166 are mounted to interface layer 224, surface 226 is separated by a distance D2 from carrier 220. D2 is greater than D1 such that surface 226 of PWB units 164-166 is vertically offset with respect to surface 225 of insulating layer 134.

Figure 6D:
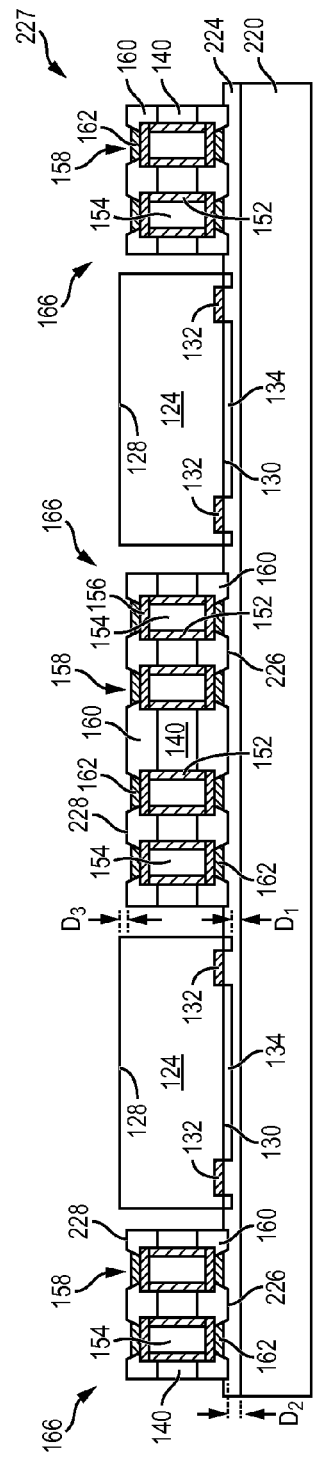

FIG. 6d shows semiconductor die 124 and PWB modular units 164-166 mounted to carrier 220 as a reconstituted wafer 227. A surface 228 of PWB units 164-166, opposite surface 226, is vertically offset with respect to back surface 128 of semiconductor die 124 by a distance of D3, e.g. at least 1 μm. By separating surface 228 of PWB units 166 and back surface 128 of semiconductor die 124 a subsequent backgrinding step is facilitated by preventing material from vertical interconnect structures 158, such as Cu, from contaminating a material of semiconductor die 124, such as Si.

Figure 6E:
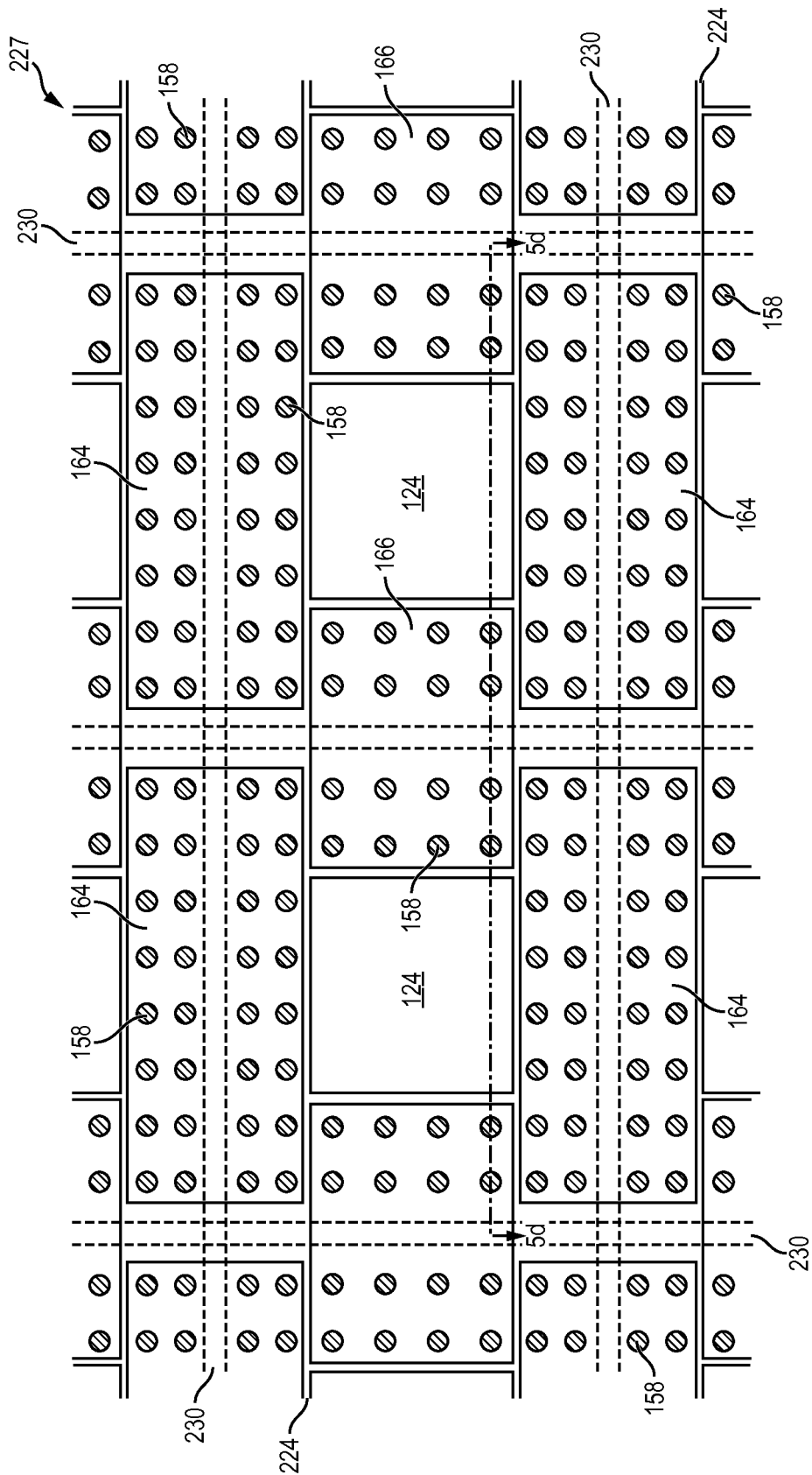

FIG. 6e shows a plan view of a portion of reconstituted wafer 227 having PWB modular units 164-166 mounted over interface layer 224. PWB units 164-166 contain multiple rows of vertical interconnect structures 158 that provide through vertical interconnection between opposing sides of the PWB units. PWB units 164-166 are disposed around semiconductor die 124 in an interlocking pattern. PWB units 164-166 are disposed around semiconductor die 124 in such a way that different sides of the semiconductor die are aligned with, and correspond to, a number of different sides of the PWB units in a repeating pattern across reconstituted wafer 227. A plurality of saw streets 230 are aligned with respect to the semiconductor die and extend across PWB units 164-166 such that when reconstituted wafer 227 is singulated along the saw streets, each semiconductor die 124 has a plurality of vertical interconnect structures 158 from singulated PWB units 164-166 that are disposed around or in a peripheral region around the semiconductor die. While PWB units 164-166 are illustrated with interlocking square and rectangular footprints, the PWB units disposed around semiconductor die 124 can include PWB units having footprints with a cross-shape (+), an angled or "L-shape," a circular or oval shape, a hexagonal shape, an octagonal shape, a star shape, or any other geometric shape.

Figure 6F:
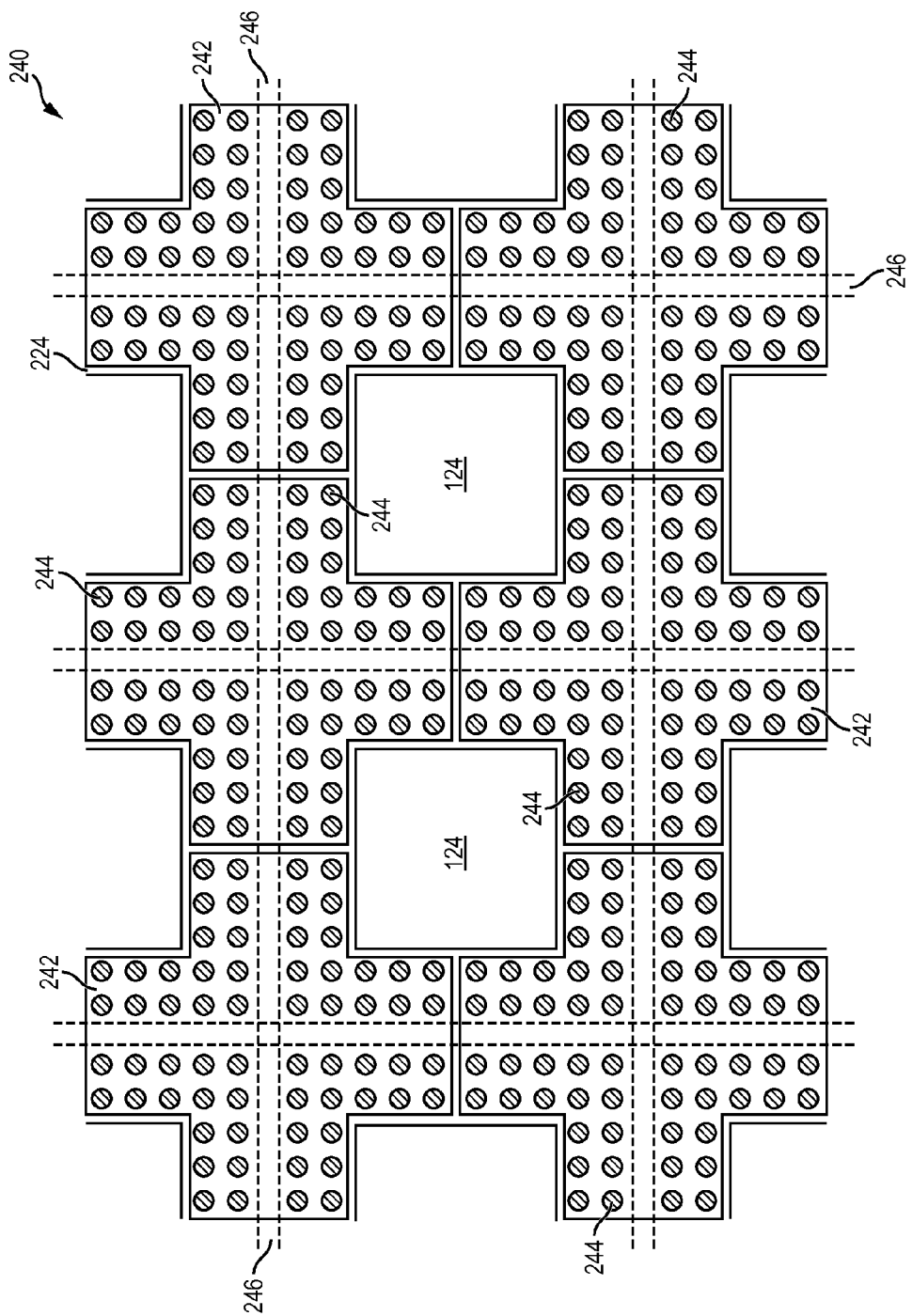

FIG. 6f shows a plan view of a portion of a reconstituted wafer 240 having cross-shaped (+) PWB modular units 242 mounted over interface layer 224. PWB units 242 are formed in a process similar to PWB units 164-166 as shown in FIGS. 4a-4h. PWB units 242 contain multiple rows of vertical interconnect structures 244 that are similar to vertical interconnect structures 158, and provide through vertical interconnection between opposing sides of the PWB units. PWB units 242 are disposed around semiconductor die 124 in an interlocking pattern. PWB units 242 are disposed around semiconductor die 124 in such a way that different sides of the semiconductor die are aligned with, and correspond to, a number of different sides of the PWB units in a repeating pattern across reconstituted wafer 240. A plurality of saw streets 246 are aligned with respect to semiconductor die 124 and extend across PWB units 242 such that when reconstituted wafer 240 is singulated along the saw streets, each semiconductor die 124 has a plurality of vertical interconnect structures 244 from singulated PWB units 242 that are disposed around or in a peripheral region around the semiconductor die. Vertical interconnect structures 244 are disposed in one or more rows offset from a perimeter of the semiconductor die after singulation through saw streets 246.

Figure 6G:
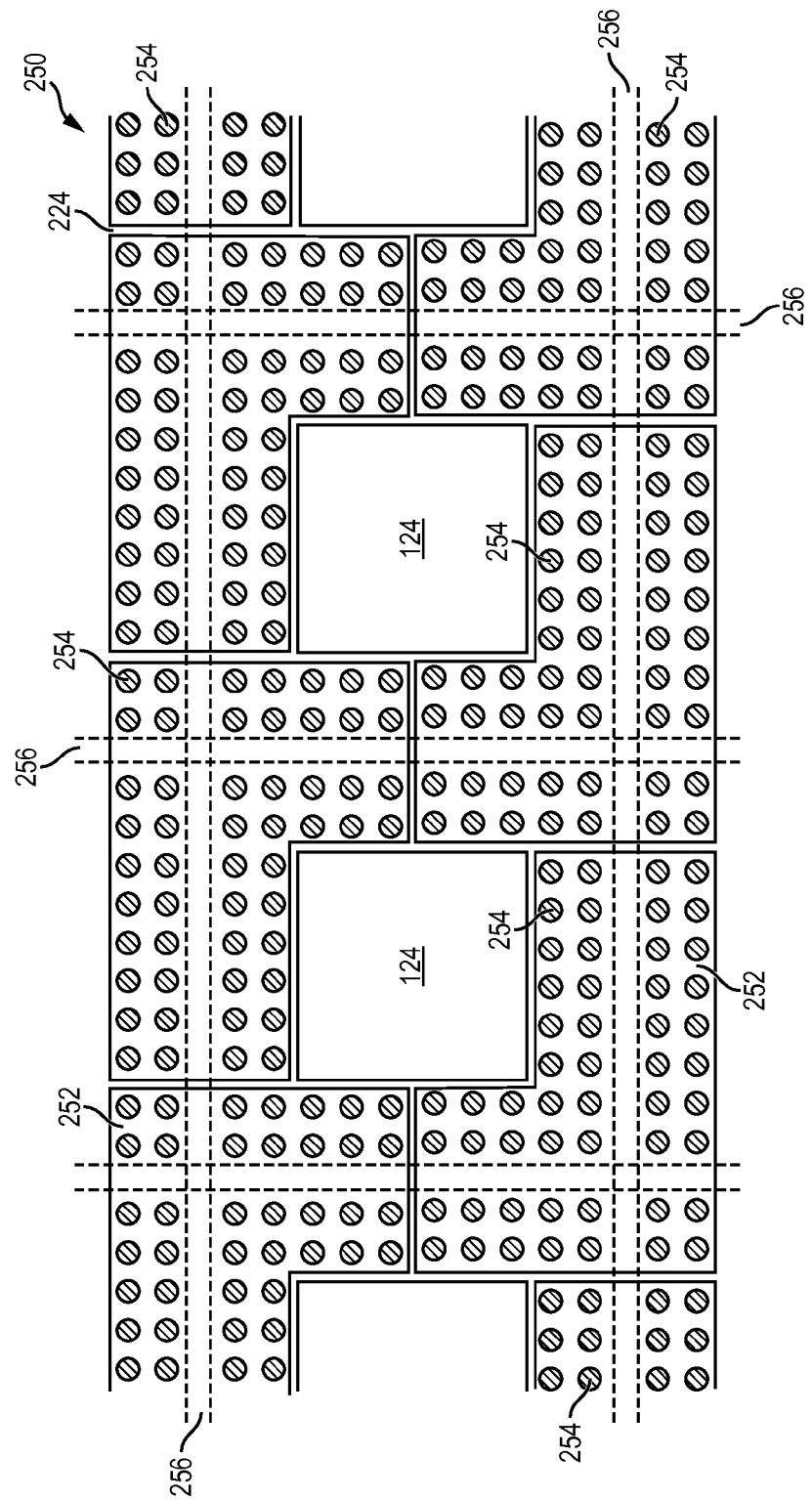

FIG. 6g shows a plan view of a portion of a reconstituted wafer 250 having angled or "L-shaped" PWB modular units 252 mounted over interface layer 224. PWB units 252 are formed in a process similar to PWB units 164-166 as shown in FIGS. 4a-4h. PWB units 252 contain multiple rows of vertical interconnect structures 254 that are similar to vertical interconnect structures 158, and provide through vertical interconnection between opposing sides of the PWB units. PWB units 252 are disposed around semiconductor die 124 in an interlocking pattern. PWB units 252 are disposed around semiconductor die 124 in such a way that different sides of the semiconductor die are aligned with, and correspond to, a number of different sides of the PWB units in a repeating pattern across reconstituted wafer 250. A plurality of saw streets 256 are aligned with respect to semiconductor die 124 and extend across PWB units 252 such that when reconstituted wafer 250 is singulated along the saw streets, each semiconductor die 124 has a plurality of vertical interconnect structures 254 from singulated PWB units 252 that are disposed around or in a peripheral region around the semiconductor die. Vertical interconnect structures 254 are disposed in one or more rows offset from a perimeter of the semiconductor die after singulation through saw streets 256.

Figure 6H:
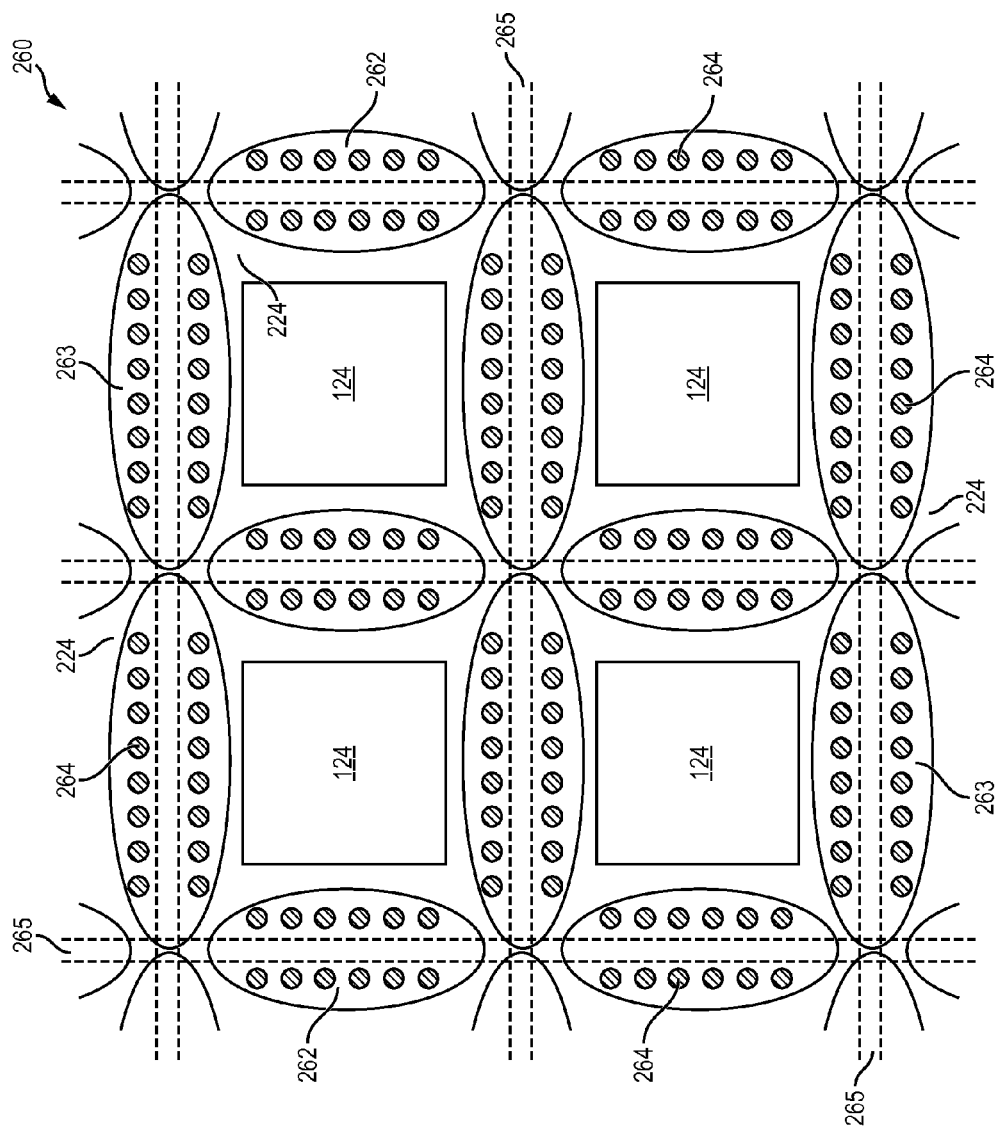

FIG. 6h shows a plan view of a portion of a reconstituted wafer 260 having circular or oval shaped PWB modular units 262 and 263 mounted over interface layer 224. PWB units 262 and 263 are formed in a process similar to PWB units 164-166 as shown in FIGS. 4a-4h. PWB units 262 and 263 contain multiple rows of vertical interconnect structures 264 that are similar to vertical interconnect structures 158, and provide through vertical interconnection between opposing sides of the PWB units. PWB units 262 and 263 are disposed around semiconductor die 124 in an interlocking pattern. PWB units 262-263 are disposed around semiconductor die 124 in such a way that different sides of the semiconductor die are aligned with, and correspond to, a number of different portions of the PWB units in a repeating pattern across reconstituted wafer 260. A plurality of saw streets 265 are aligned with respect to semiconductor die 124 and extend across PWB units 262 and 263 such that when reconstituted wafer 260 is singulated along the saw streets, each semiconductor die 124 has a plurality of vertical interconnect structures 264 from singulated PWB units 262 and 263 that are disposed around or in a peripheral region around the semiconductor die. Vertical interconnect structures 264 are disposed in one or more rows offset from a perimeter of the semiconductor die after singulation through saw streets 265.

Figure 6I:
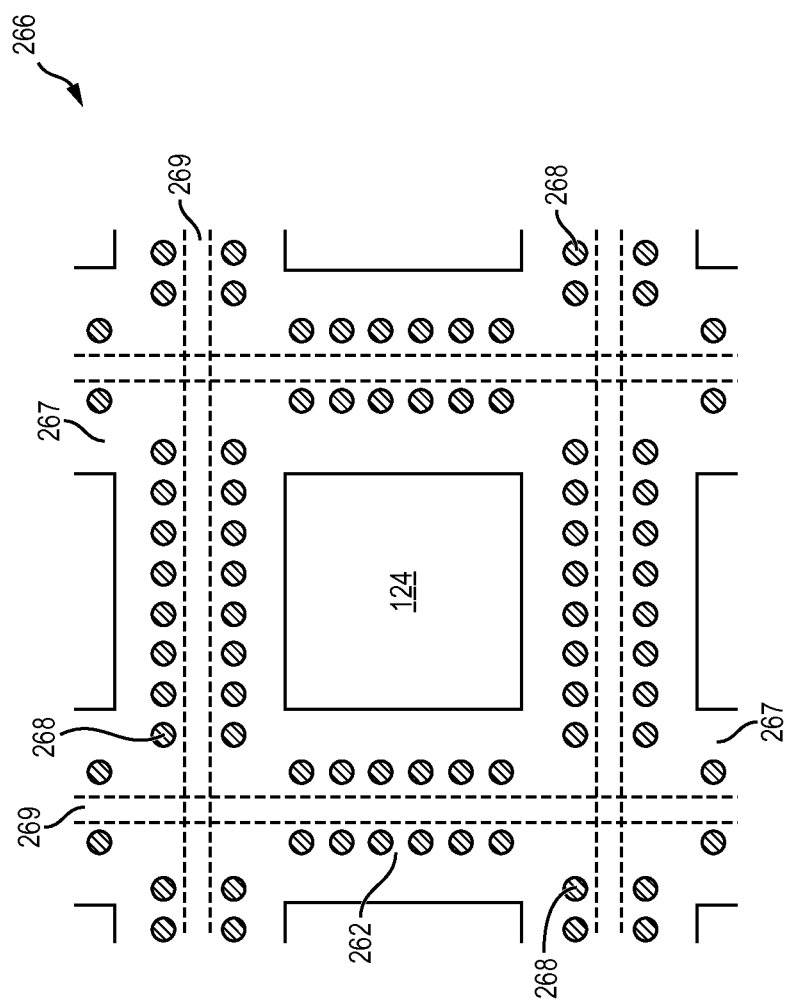

FIG. 6i shows a plan view of a portion of a reconstituted wafer 266 having a continuous PWB unit 267 mounted over interface layer 224. PWB unit 267 is formed in a process similar to PWB units 164-166 as shown in FIGS. 4a-4h. Semiconductor die 124 are disposed within openings of PWB unit 267 with 50 μm clearance. PWB unit 267 contain multiple rows of vertical interconnect structures 268 that are similar to vertical interconnect structures 158, and provide through vertical interconnection between opposing sides of the PWB units. A plurality of saw streets 269 are aligned with respect to semiconductor die 124 and extend across PWB unit 267 such that when reconstituted wafer 266 is singulated along the saw streets, each semiconductor die 124 has a plurality of vertical interconnect structures 268 from singulated PWB unit 267 that are disposed around or in a peripheral region around the semiconductor die. Vertical interconnect structures 268 can be disposed in the peripheral region around semiconductor 124 as one or more rows offset from a perimeter of the semiconductor die after singulation through saw streets 269.

Continuing from FIG. 6d, FIG. 6j shows that after semiconductor die 124 and PWB modular units 164-166 are mounted to interface layer 224, reconstituted wafer 227 is partially singulated through saw street 230 using a saw blade or laser cutting tool 270 to form channels or openings 272. Channel 272 extends through PWB units 164-166, and additionally may extend through interface layer 224 and partially but not completely through carrier 220. Channel 272 forms a separation among vertical interconnect structures 158 and the semiconductor die 124 to which the conductive vias will be subsequently joined in a Fo-PoP.

In FIG. 6k, an encapsulant or molding compound 282 is deposited over semiconductor die 124, PWB units 164-166, and carrier 220 using a paste printing, compressive molding, transfer molding, liquid encapsulant molding, vacuum lamination, spin coating, or other suitable applicator. Encapsulant 282 can be polymer composite material, such as epoxy resin with filler, epoxy acrylate with filler, or polymer with proper filler. Encapsulant 282 is non-conductive and environmentally protects the semiconductor device from external elements and contaminants.

In FIG. 6l, surface 290 of encapsulant 282 undergoes a grinding operation with grinder 292 to planarize the surface and reduce a thickness of the encapsulant. The grinding operation removes a portion of encapsulant material down to back surface 128 of semiconductor die 124. A chemical etch can also be used to remove and planarize encapsulant 282. Because surface 228 of PWB units 166 is vertically offset with respect to back surface 128 of semiconductor die 124 by distance D3, the removal of encapsulant 282 can be achieved without removing, and incidentally transferring, material from vertical interconnect structures 158, such as Cu, to semiconductor die 124, such as Si. Preventing the transfer of conductive material from vertical interconnect structures 158 to semiconductor die 124 reduces a risk of contaminating a material of the semiconductor die.

In FIG. 6m, an insulating or passivation layer 296 is conformally applied over encapsulant 282 and semiconductor die 124 using PVD, CVD, screen printing, spin coating, or spray coating. The insulating layer 296 contains one or more layers of SiO2, Si3N4, SiON, Ta2O5, Al2O3, or other material having similar insulating and structural properties. The insulating layer 296 uniformly covers encapsulant 282 and semiconductor die 124 and is formed over PWB units 164-166. The insulating layer 296 is formed after the removal of a first portion of encapsulant 282 and contacts the exposed back surface 128 of semiconductor die 128. The insulating layer 296 is formed before a second portion of encapsulant 282 is removed to expose PWB units 164-166. In one embodiment, properties of insulating layer 296 are selected to help control warping of the subsequently formed Fo-PoP.

Figure 6N:
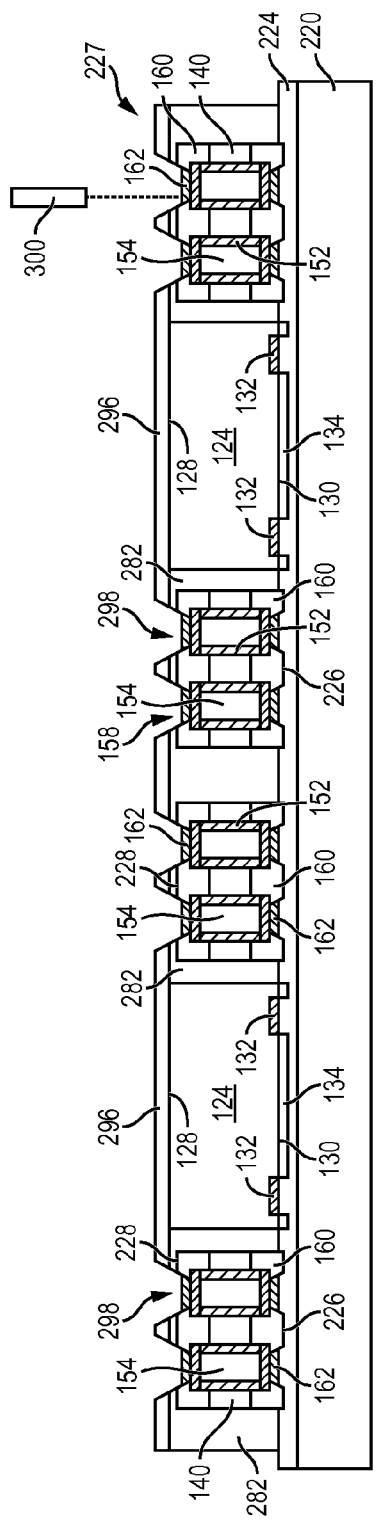

In FIG. 6n, a portion of insulating layer 296 and encapsulant 282 is removed to form openings 298 and expose vertical interconnect structures 158. Openings 298 are formed by etching, laser, or other suitable process. In one embodiment, openings 298 are formed by LDA using laser 300. Material from vertical interconnect structures 158 is prevented from contacting semiconductor die 124 during removal of encapsulant 282 because openings 298 are formed over vertical interconnect structures 158 around or in a peripheral region around semiconductor die 124, such that vertical interconnect structures 158 are offset with respect to semiconductor die 124 and do not extend to back surface 128. Furthermore, openings 298 are not formed at a time when encapsulant 282 is being removed from over back surface 128 and at a time when semiconductor die 124 is exposed and susceptible to contamination. Because openings 298 are formed after insulating layer 296 is disposed over semiconductor die 124, the insulating layer acts as a barrier to material from vertical interconnect structures 158 being transferred to semiconductor die 124.

Figure 6O:
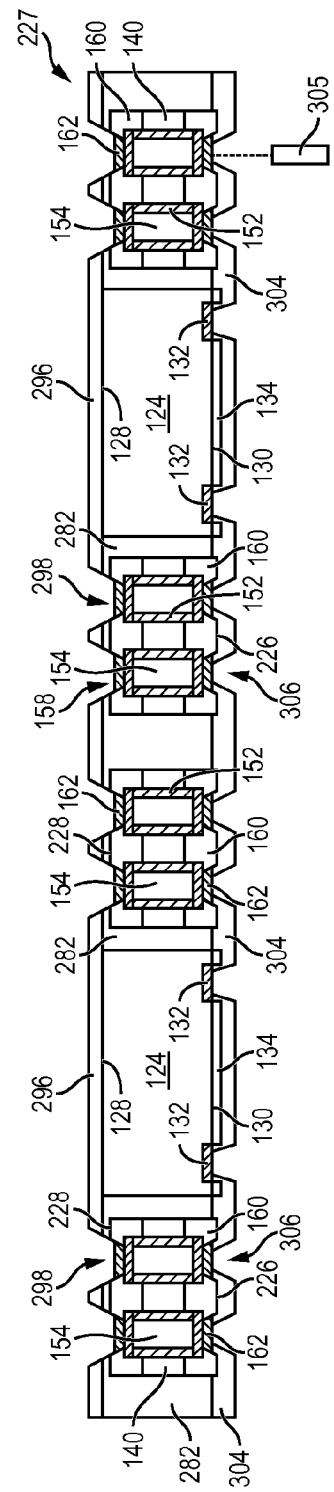

In FIG. 6o, carrier 220 and interface layer 224 are removed from reconstituted wafer 227 by chemical etching, mechanical peeling, CMP, mechanical grinding, thermal bake, UV light, laser scanning, or wet stripping to facilitate the formation of an interconnect structure over active surface 130 of semiconductor die 124 and vertical interconnect structures 158 of PWB units 164-166.

FIG. 6o also shows a first portion of an interconnect or RDL is formed by the deposition and patterning of insulating or passivation layer 304. The insulating layer 304 is conformally applied to, and has a first surface that follows the contours of, encapsulant 282, PWB units 164-166, and semiconductor die 124. The insulating layer 304 has a second planar surface opposite the first surface. The insulating layer 304 contains one or more layers of SiO2, Si3N4, SiON, Ta2O5, Al2O3, or other material having similar insulating and structural properties. The insulating layer 304 is deposited using PVD, CVD, printing, spin coating, spray coating, or other suitable process. A portion of insulating layer 304 is removed by LDA using laser 305, etching, or other suitable process to form openings 306 over vertical interconnect structures 158. Openings 306 expose conductive layer 164 of vertical interconnect structures 158 for subsequent electrical connection according to the configuration and design of semiconductor die 124.

In FIG. 6p, an electrically conductive layer 308 is patterned and deposited over insulating layer 304, over semiconductor die 124, and disposed within openings 306 to fill the openings and contact conductive layer 164 of vertical interconnect structures 158 as well as contact conductive layer 132. Conductive layer 308 can be one or more layers of Al, Cu, Sn, Ni, Au, Ag, or other suitable electrically conductive material. The deposition of conductive layer 308 uses PVD, CVD, electrolytic plating, electroless plating, or other suitable process. Conductive layer 308 operates as an RDL to extend electrical connection from semiconductor die 124 to points external to semiconductor die 124.

FIG. 6p also shows an insulating or passivation layer 310 is conformally applied to, and follows the contours of, insulating layer 304 and conductive layer 308. The insulating layer 310 contains one or more layers of SiO2, Si3N4, SiON, Ta2O5, Al2O3, or other material having similar insulating and structural properties. The insulating layer 310 is deposited using PVD, CVD, printing, spin coating, spray coating, or other suitable process. A portion of insulating layer 310 is removed by LDA using laser 311, etching, or other suitable process to form openings 312, which expose portions of conductive layer 308 for subsequent electrical interconnection.

In FIG. 6q, an electrically conductive layer 316 is patterned and deposited over insulating layer 310, over conductive layer 308, and is disposed within openings 312 to fill the openings and contact conductive layer 308. Conductive layer 316 can be one or more layers of Al, Cu, Sn, Ni, Au, Ag, or other suitable electrically conductive material. The deposition of conductive layer 316 uses PVD, CVD, electrolytic plating, electroless plating, or other suitable process. Conductive layer 316 operates as an RDL to extend electrical connection from semiconductor die 124 to points external to semiconductor die 124.

FIG. 6q also shows an insulating or passivation layer 318 is conformally applied to, and follows the contours of, insulating layer 310 and conductive layer 316. The insulating layer 318 contains one or more layers of SiO2, Si3N4, SiON, Ta2O5, Al2O3, or other material having similar insulating and structural properties. The insulating layer 318 is deposited using PVD, CVD, printing, spin coating, spray coating, or other suitable process. A portion of insulating layer 318 is removed by LDA, etching, or other suitable process to form openings 320, which expose portions of conductive layer 316 for subsequent electrical interconnection.

In FIG. 6r, an electrically conductive bump material is deposited over conductive layer 316 and within openings 320 of insulating layer 318 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 316 using a suitable attachment or bonding process. In one embodiment, the bump material is reflowed by heating the material above its melting point to form spherical balls or bumps 322. In some applications, bumps 322 are reflowed a second time to improve electrical contact to conductive layer 316. In one embodiment, bumps 322 are formed over a UBM having a wetting layer, barrier layer, and adhesive layer. The bumps can also be compression bonded to conductive layer 316. Bumps 322 represent one type of interconnect structure that can be formed over conductive layer 316. The interconnect structure can also use bond wires, conductive paste, stud bump, micro bump, or other electrical interconnect.

Taken together, insulating layers 304, 310, and 318 as well as conductive layers 308, 316, and conductive bumps 322 form build-up interconnect structure 324. The number of insulating and conductive layers included within build-up interconnect structure 324 depends on, and varies with, the complexity of the circuit routing design. Accordingly, build-up interconnect structure 324 can include any number of insulating and conductive layers to facilitate electrical interconnect with respect to semiconductor die 124. Similarly, PWB units 164-166 may include additional metal layers to facilitate design integration and increased routing flexibility before build-up interconnect structure 324 is formed over the PWB units. Furthermore, elements that would otherwise be included in a backside interconnect structure or RDL can be integrated as part of build-up interconnect structure 324 to simplify manufacturing and reduce fabrication costs with respect to a package including both front side and backside interconnects or RDLs.

FIG. 6r further shows that reconstituted wafer 227 with build-up interconnect structure 324 is singulated using a saw blade or laser cutting tool 326 to form individual Fo-PoP 328. In one embodiment, Fo-PoP 328 has a height in a range of less than 1 mm. PWB modular units 164-166 within Fo-PoP 328 provide a cost effective alternative to using standard laser drilling processes for vertical interconnection in Fo-PoP for a number of reasons. First, PWB units 164-166 can be made with low cost manufacturing technology such as substrate manufacturing technology rather than standard laser drilling that includes high equipment cost and requires drilling through an entire package thickness which increases cycle time and decrease manufacturing throughput. Furthermore, the use of PWB units 164-166 for Fo-PoP vertical interconnection provides an advantage of improved control for vertical interconnection with respect to vertical interconnections formed exclusively by a laser drilling process.

PWB modular units 164-166 contain one or multiple rows of vertical interconnect structures 158 that provide through vertical interconnection between opposing sides of the PWB units and are configured to be integrated into subsequently formed Fo-PoP. Vertical interconnect structures 158 include vias 150 that are left void or alternatively is filled with filler material 154, e.g. conductive material or insulating material. Filler material 154 is specially selected to be softer or more compliant than conductive layer 152. Filler material 154 reduces the incidence of cracking or delamination by allowing vertical interconnect structures 158 to deform or change shape under stress. In one embodiment, vertical interconnect structures 158 include conductive layer 162 that is a copper protection layer for preventing oxidation of the conductive via, thereby reducing yield loss in SMT applications.

PWB modular units 164-166 are disposed within Fo-PoP 328 such that surface 228 of PWB units 166 and a corresponding surface of PWB units 164 are vertically offset with respect to back surface 128 of semiconductor die 124 by a distance D3. The separation of D3 prevents material from vertical interconnect structures 158, such as Cu, from incidentally transferring to, and contaminating a material of, semiconductor die 124, such as Si. Preventing contamination of semiconductor die 124 from material of vertical interconnect structures 158 is further facilitated by exposing conductive layer 162 by LDA or another removal process separate from the grinding operation of shown in FIG. 6l. Furthermore, the presence of insulating layer 296 over back surface 128 of semiconductor die 124 before the formation of openings 298 serves as a barrier to material from vertical interconnect structures 158 reaching the semiconductor die.

PWB modular units 164-166 disposed within Fo-PoP 328 can differ in size and shape one from another while still providing through vertical interconnect for the Fo-PoP. PWB units 164-166 include interlocking footprints having square and rectangular shapes, a cross-shape (+), an angled or "L-shape," a circular or oval shape, a hexagonal shape, an octagonal shape, a star shape, or any other geometric shape. At the wafer level, and before singulation, PWB units 164-166 are disposed around semiconductor die 124 in an interlocking pattern such that different sides of the semiconductor die are aligned with, and correspond to, a number of different sides of the PWB units in a repeating pattern. PWB units 164-166 may also include additional metal layers to facilitate design integration and increased routing flexibility before build-up interconnect structure 324 is formed over the PWB units.

PWB modular units 164-166 provide a cost effective alternative to using standard laser drilling processes for vertical interconnection in Fo-PoP for a number of reasons. First, PWB units 164-166 can be made with low cost manufacturing technology such as substrate manufacturing technology. Second, standard laser drilling includes high equipment cost and requires drilling through an entire package thickness, which increases cycle time and decrease manufacturing throughput. Furthermore, the use of PWB units 164-166 for vertical interconnection provides an advantage of improved control for vertical interconnection with respect to vertical interconnections formed exclusively by a laser drilling process.

FIG. 7a shows an embodiment of vertical interconnect structure 340 with laminate core 342, conductive layers 344 and 346, and filler material 348. Filler material 348 can be conductive material or insulating material. Conductive layer 344 overlaps laminate core 342 by 0-200 μm. A Cu protective layer 350 is formed over conductive layer 346. An insulating layer 352 is formed over one surface of laminate core 342. A portion of insulating layer 352 is removed to expose Cu protective layer 350.

FIG. 7b shows an embodiment of vertical interconnect structure 360 with laminate core 362, conductive layers 364 and 366, and filler material 368. Filler material 368 can be conductive material or insulating material. Conductive layer 364 overlaps laminate core 362 by 0-200 µm. A Cu protective layer 370 is formed over conductive layer 366.

FIG. 7c shows an embodiment of vertical interconnect structure 380 with laminate core 382, conductive layers 384 and 386, and filler material 388. Filler material 388 can be conductive material or insulating material. Conductive layer 384 overlaps laminate core 382 by 0-200 µm. A Cu protective layer 390 is formed over conductive layer 346. An insulating layer 392 is formed over one surface of laminate core 382. An insulating layer 394 is formed over an opposite surface of laminate core 382. A portion of insulating layer 394 is removed to expose Cu protective layer 386.

FIG. 7d shows an embodiment of vertical interconnect structure 400 with laminate core 402, conductive layers 404 and 406, and filler material 408. Filler material 408 can be conductive material or insulating material. Conductive layer 404 overlaps laminate core 402 by 0-200 µm.

FIG. 7e shows an embodiment of vertical interconnect structure 410 with laminate core 412, conductive layer 414, and filler material 416. Filler material 416 can be conductive material or insulating material. Conductive layer 414 overlaps laminate core 412 by 0-200 µm. An insulating layer 418 is formed over one surface of laminate core 412. A portion of insulating layer 418 is removed to expose conductive layer 414. A conductive layer 420 is formed over the expose conductive layer 414. A Cu protective layer 422 is formed over conductive layer 420. An insulating layer 424 is formed over an opposite surface of laminate core 412. A conductive layer 426 is formed over the expose conductive layer 414.

FIG. 7f shows an embodiment of vertical interconnect structure 430 with laminate core 432, conductive layer 434, and filler material 436. Filler material 436 can be conductive material or insulating material. Conductive layer 434 overlaps laminate core 432 by 0-200 µm. An insulating layer 438 is formed over one surface of laminate core 432. A portion of insulating layer 438 is removed to expose conductive layer 434. A conductive layer 440 is formed over the expose conductive layer 434. A Cu protective layer 442 is formed over conductive layer 420. An insulating layer 444 is formed over an opposite surface of laminate core 432. A conductive layer 446 is formed over the expose conductive layer 434. A Cu protective layer 446 is formed over conductive layer 446.

FIG. 7g shows an embodiment of vertical interconnect structure 450 with laminate core 452, conductive layers 454 and 456, and filler material 458. Filler material 458 can be conductive material or insulating material. Conductive layer 454 overlaps laminate core 452 by 0-200 µm. A Cu protective layer 460 is formed over conductive layer 456. An insulating layer 462 is formed over one surface of laminate core 452. A portion of insulating layer 462 is removed to expose Cu protective layer 460. An insulating layer 464 is formed over an opposite surface of laminate core 452. A portion of insulating layer 464 is removed to expose Cu protective layer 460.

FIG. 7h shows an embodiment of vertical interconnect structure 470 with laminate core 472, conductive layers 474 and 476, and filler material 478. Filler material 478 can be conductive material or insulating material. Conductive layer 474 overlaps laminate core 472 by 0-200 µm. A Cu protective layer 480 is formed over conductive layer 476. An insulating layer 482 is formed over one surface of laminate core 472. An insulating layer 484 is formed over an opposite surface of laminate core 472. A portion of insulating layer 484 is removed to expose Cu protective layer 480.

FIG. 7i shows an embodiment of vertical interconnect structure 490 with laminate core 492, conductive layers 494 and 496, and filler material 498. Filler material 498 can be conductive material or insulating material. Conductive layer 494 overlaps laminate core 492 by 0-200 µm. A Cu protective layer 500 is formed over conductive layer 496. An insulating layer 502 is formed over an opposite surface of laminate core 492. A portion of insulating layer 502 is removed to expose Cu protective layer 480. A Cu protective layer 504 is formed over the exposed conductive layer 496.

Figure 8A:
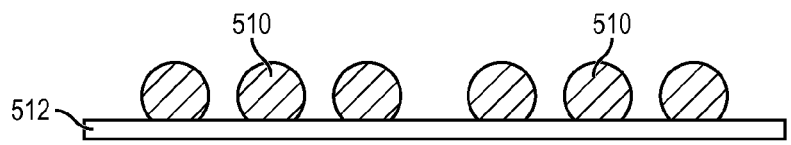
FIGS. 8a-8c illustrate a process of forming a PWB modular unit with vertical interconnect structures containing bumps.
Figure 8B:
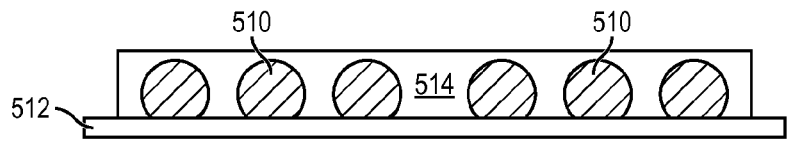
Figure 8C:
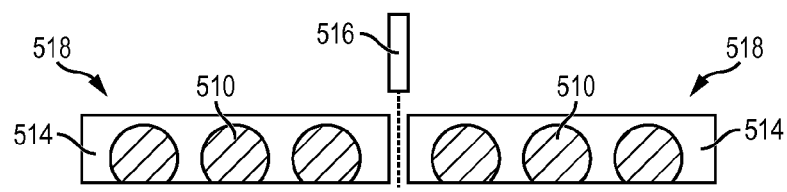

In FIG. 8a, a plurality of bumps 510 is formed over Cu foil 512, or other foil or carrier with thin patterned Cu or other wetting material layer. The foil or supporting layer can be evenly bonded to temporary carrier with thermal releasing tape which can stand reflow temperature. In FIG. 8b, an encapsulant 514 is formed over bumps 510 and Cu foil 512. In FIG. 8c, Cu foil 512 is removed and bumps 510 embedded in encapsulant 514 is singulated with saw blade or laser cutting tool 516 into PWB vertical interconnect units 518.

Figure 9:
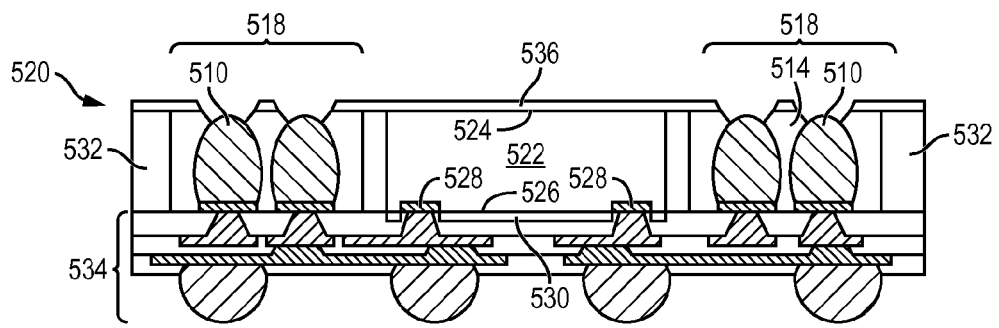
FIG. 9 illustrates a Fo-PoP with semiconductor die interconnected by PWB modular units having vertical interconnect structures containing bumps.

FIG. 9 shows a Fo-PoP 520 including semiconductor die 522, which is similar to semiconductor die 124 from FIG. 3c. Semiconductor die 522 has a back surface 524 and active surface 526 opposite back surface 524 containing analog or digital circuits implemented as active devices, passive devices, conductive layers, and dielectric layers formed within the die and electrically interconnected according to the electrical design and function of the die. An electrically conductive layer 528 is formed over active surface 526 and operates as contact pads that are electrically connected to the circuits on active surface 526. An insulating or passivation layer 530 is conformally applied over active surface 526.

FIG. 9 also shows PWB modular units 518 from FIGS. 8a-8c laterally offset from, and disposed around or in a peripheral region around semiconductor die 522. Back surface 524 of semiconductor die 522 is offset from PWB modular units 518 by at least 1 µm, similar to FIG. 5b. Encapsulant 532 is deposited around PWB units 518. A build-up interconnect structure 534, similar to build-up interconnect structure 180 in FIG. 5e, is formed over encapsulant 532, PWB units 518, and semiconductor die 522. An insulating or passivation layer 536 is formed over encapsulant 532, PWB units 518, and semiconductor die 522. A portion of encapsulant 514 and insulating layer 536 is removed to expose bumps 510. Bumps 510 are offset from back surface 524 of semiconductor die 522 by at least 1 µm.

Figure 10:
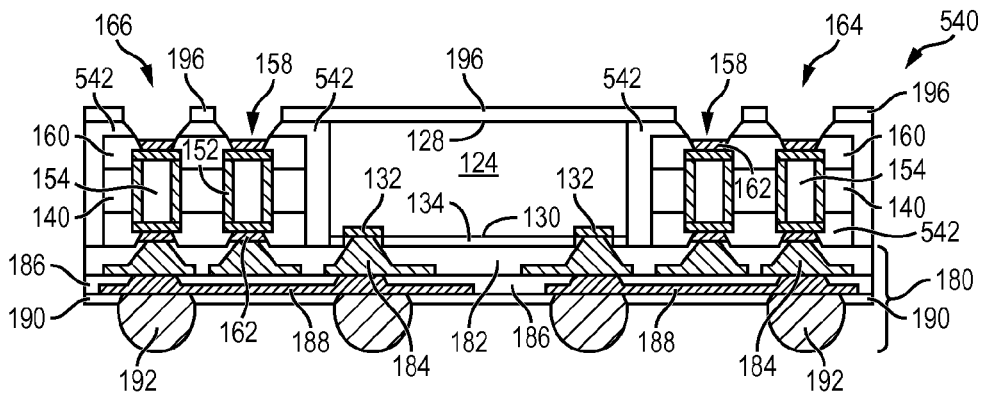
FIG. 10 illustrates another Fo-PoP with semiconductor die interconnected by PWB modular units having vertical interconnect structures.

FIG. 10 shows an embodiment of Fo-PoP 540, similar to FIG. 5h, with encapsulant 542 disposed around PWB units 164-166.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor die;
   providing a plurality of modular interconnect units by providing a core material and forming a plurality of vertical interconnect structures extending through the core material to a surface of the modular interconnect units;
   disposing the modular interconnect units and semiconductor die in proximity to each other;

depositing an encapsulant over and around the semiconductor die and modular interconnect units;
removing a first portion of the encapsulant extending to a surface of the semiconductor die while leaving a second portion of the encapsulant over the surface of the modular interconnect units; and
forming an opening through the second portion of the encapsulant extending to the vertical interconnect structures of the modular interconnect units.

2. The method of claim 1, further including forming an interconnect structure over the semiconductor die and modular interconnect units.

3. The method of claim 1, further including forming an insulating layer over the surface of the semiconductor die and modular interconnect units.

4. The method of claim 1, wherein providing the modular interconnect units further includes:
forming a first insulating layer over a first surface of the core material; and
forming a second insulating layer over a second surface of the core material opposite the first surface of the core material.

5. The method of claim 1, wherein the modular interconnect units include a cross-shape, angled or L-shape, circular shape, or oval shape.

6. The method of claim 1, wherein a height of the modular interconnect units is less than a height of the semiconductor die.

7. A method of making a semiconductor device, comprising:
providing a semiconductor die;
providing a plurality of modular interconnect units by,
(a) providing a core material,
(b) forming a plurality of conductive interconnect structures extending through the core material to a surface of the modular interconnect units, and
(c) forming a first insulating layer over a first surface of the core material;
disposing the modular interconnect units around the semiconductor die;
depositing an encapsulant over and around the semiconductor die and modular interconnect units;
removing a first portion of the encapsulant while leaving a second portion of the encapsulant over the surface of the modular interconnect units; and
forming an opening through the second portion of the encapsulant extending to the conductive interconnect structures of the modular interconnect units.

8. The method of claim 7, wherein providing the modular interconnect units further includes forming a second insulating layer over a second surface of the core material opposite the first surface of the core material.

9. The method of claim 7, wherein the conductive interconnect structures each include a metal cap and a protection layer formed over the metal cap.

10. The method of claim 7, further including removing the first portion of the encapsulant extending to a surface of the semiconductor die.

11. The method of claim 7, further including forming an interconnect structure over the semiconductor die and modular interconnect units.

12. The method of claim 7, wherein the modular interconnect units include a cross-shape, angled or L-shape, circular shape, or oval shape.

13. A method of making a semiconductor device, comprising:
providing a semiconductor die;
providing a plurality of modular interconnect units by providing a core material and forming a plurality of conductive interconnect structures extending through the core material to a surface of the modular interconnect units;
disposing a plurality of modular interconnect units around the semiconductor die, wherein a height of the modular interconnect units is less than a height of the semiconductor die;
depositing an encapsulant over and around the semiconductor die and modular interconnect units; and
forming an opening through the encapsulant over the modular interconnect units extending to the conductive interconnect structures of the modular interconnect units.

14. The method of claim 13, further including forming an internal filler material within the conductive interconnect structures.

15. The method of claim 14, wherein the internal filler material includes an insulating material.

16. The method of claim 13, further including:
forming a first insulating layer over a first surface of the core material; and
forming a second insulating layer over a second surface of the core material opposite the first surface of the core material.

17. The method of claim 13, wherein the conductive interconnect structures each include a metal cap and a protection layer formed over the metal cap.

18. The method of claim 13, wherein forming the opening in the encapsulant includes:
removing a first portion of the encapsulant while leaving a second portion of the encapsulant over the surface of the modular interconnect units; and
removing part of the second portion of the encapsulant extending to the conductive interconnect structures of the modular interconnect units.

19. The method of claim 13, wherein the modular interconnect units include a cross-shape, angled or L-shape, circular shape, or oval shape.

20. A semiconductor device, comprising:
a semiconductor die;
a modular interconnect unit disposed around the semiconductor die, wherein the modular interconnect unit includes a core material and a plurality of vertical interconnect structures extending through the core material and a height of the modular interconnect unit is less than a height of the semiconductor die; and
an encapsulant deposited around the semiconductor die and modular interconnect unit with an opening through the encapsulant over the modular interconnect unit extending to the vertical interconnect structures of the modular interconnect unit.

21. The semiconductor device of claim 20, further including an internal filler material formed within the vertical interconnect structures.

22. The semiconductor device of claim 21, wherein the internal filler material includes an insulating material.

23. The semiconductor device of claim 20, further including:
a first insulating layer formed over a first surface of the core material; and
a second insulating layer formed over a second surface of the core material opposite the first surface of the core material.

24. The semiconductor device of claim 20, further including an interconnect structure formed over the semiconductor die and modular interconnect unit.

25. The semiconductor device of claim 20, wherein the modular interconnect unit includes a cross-shape, angled or L-shape, circular shape, or oval shape.

* * * * *